(12) United States Patent
Yamashita et al.

(10) Patent No.: US 10,892,331 B2
(45) Date of Patent: Jan. 12, 2021

(54) CHANNEL ORIENTATION OF CMOS GATE-ALL-AROUND FIELD-EFFECT TRANSISTOR DEVICES FOR ENHANCED CARRIER MOBILITY

(71) Applicant: International Business Machines Corporation, Armonk, NY (US)

(72) Inventors: Tenko Yamashita, Schenectady, NY (US); Myung-Hee Na, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/431,866

(22) Filed: Jun. 5, 2019

(65) Prior Publication Data

US 2020/0388681 A1    Dec. 10, 2020

(51) Int. Cl.
| | |
|---|---|
| *H01L 29/423* | (2006.01) |
| *H01L 29/78* | (2006.01) |
| *H01L 29/10* | (2006.01) |
| *H01L 21/84* | (2006.01) |
| *H01L 29/06* | (2006.01) |
| *H01L 29/775* | (2006.01) |
| *H01L 21/8238* | (2006.01) |
| *H01L 29/66* | (2006.01) |

(52) U.S. Cl.
CPC .. *H01L 29/1033* (2013.01); *H01L 21/823821* (2013.01); *H01L 21/845* (2013.01); *H01L 29/0673* (2013.01); *H01L 29/66439* (2013.01); *H01L 29/775* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 8,084,308 B2 | 12/2011 | Chang et al. | |
| 8,216,902 B2 | 7/2012 | Chang et al. | |
| 9,355,887 B2 | 5/2016 | Chan et al. | |
| 9,559,160 B2 | 1/2017 | Cappellani et al. | |
| 9,570,609 B2 | 2/2017 | Obradovic et al. | |
| 9,583,507 B2 | 2/2017 | Cheng et al. | |
| 9,659,829 B1 | 5/2017 | Balakrishnan et al. | |
| 10,332,803 B1* | 6/2019 | Xie | H01L 29/42392 |
| 10,490,559 B1* | 11/2019 | Ando | H01L 29/401 |
| 2008/0251880 A1 | 10/2008 | Cohen et al. | |
| 2015/0303258 A1 | 10/2015 | Kuhn et al. | |
| 2020/0035563 A1* | 1/2020 | Zhang | H01L 27/0886 |

OTHER PUBLICATIONS

L. Chang et al., "CMOS Circuit Performance Enhancement by Surface Orientation Optimization," IEEE Transactions on Electron Devices, Oct. 2004, pp. 1621-1627, vol. 51, No. 10.

* cited by examiner

*Primary Examiner* — Daniel Whalen
(74) *Attorney, Agent, or Firm* — Robert Sullivan; Ryan, Mason & Lewis, LLP

(57) ABSTRACT

Techniques are provided to fabricate semiconductor integrated circuit devices which include complementary metal-oxide-semiconductor gate-all-around field-effect transistor devices (e.g., nanosheet field-effect transistor devices), wherein the channel orientation layout of N-type and P-type field-effect transistor devices are independently configured to provide enhanced carrier mobility in the channel layers of the different type field-effect transistor devices.

20 Claims, 18 Drawing Sheets

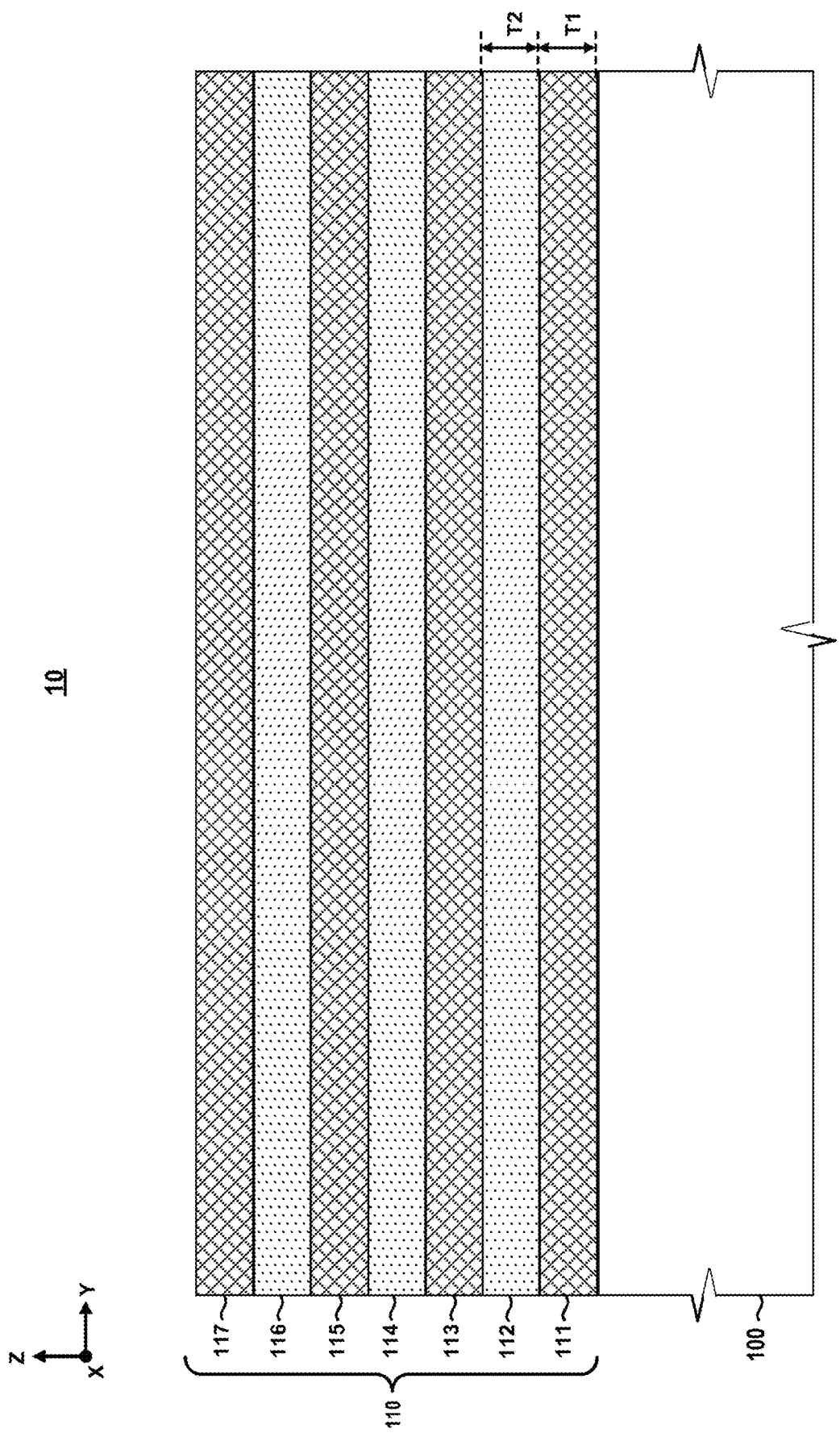

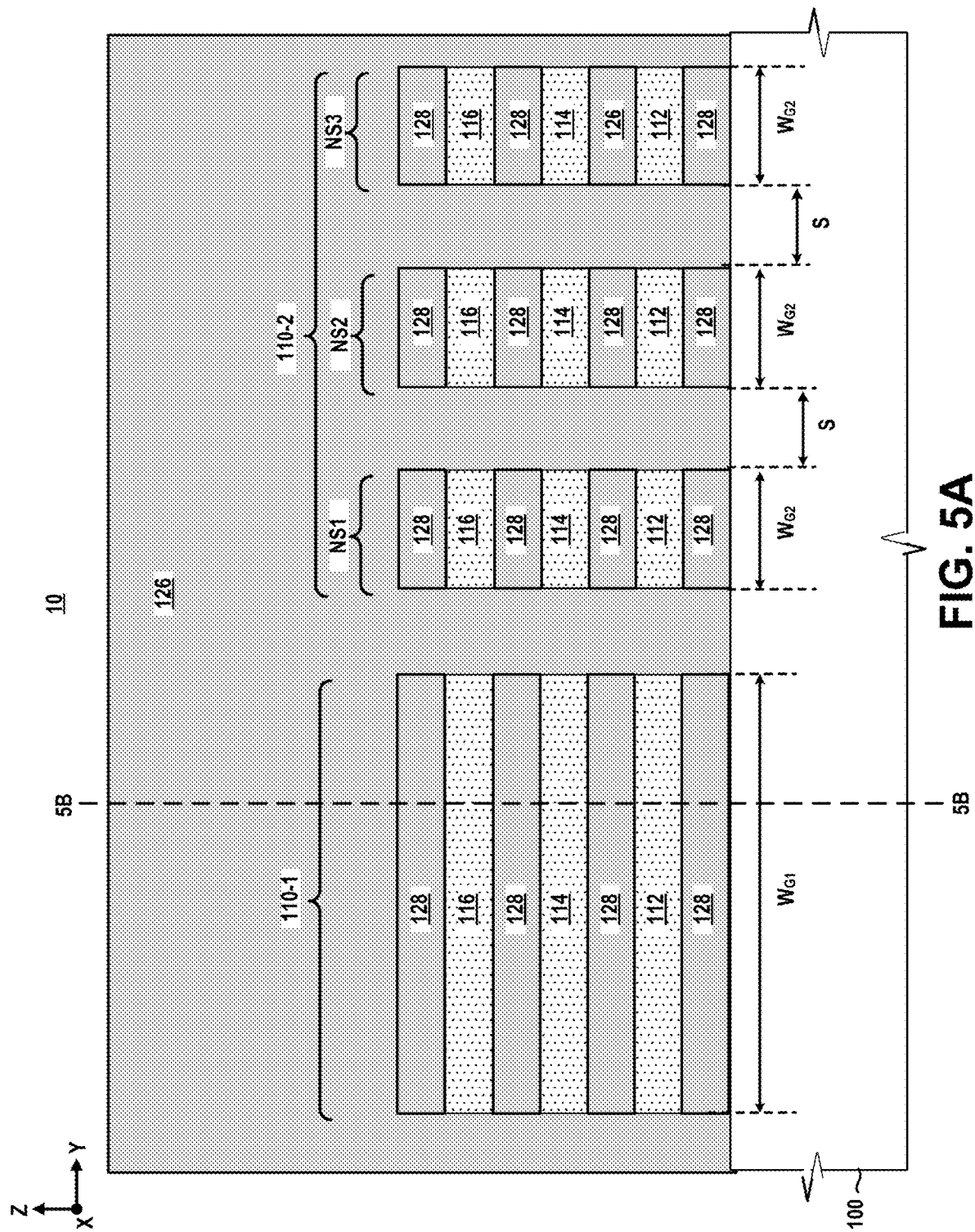

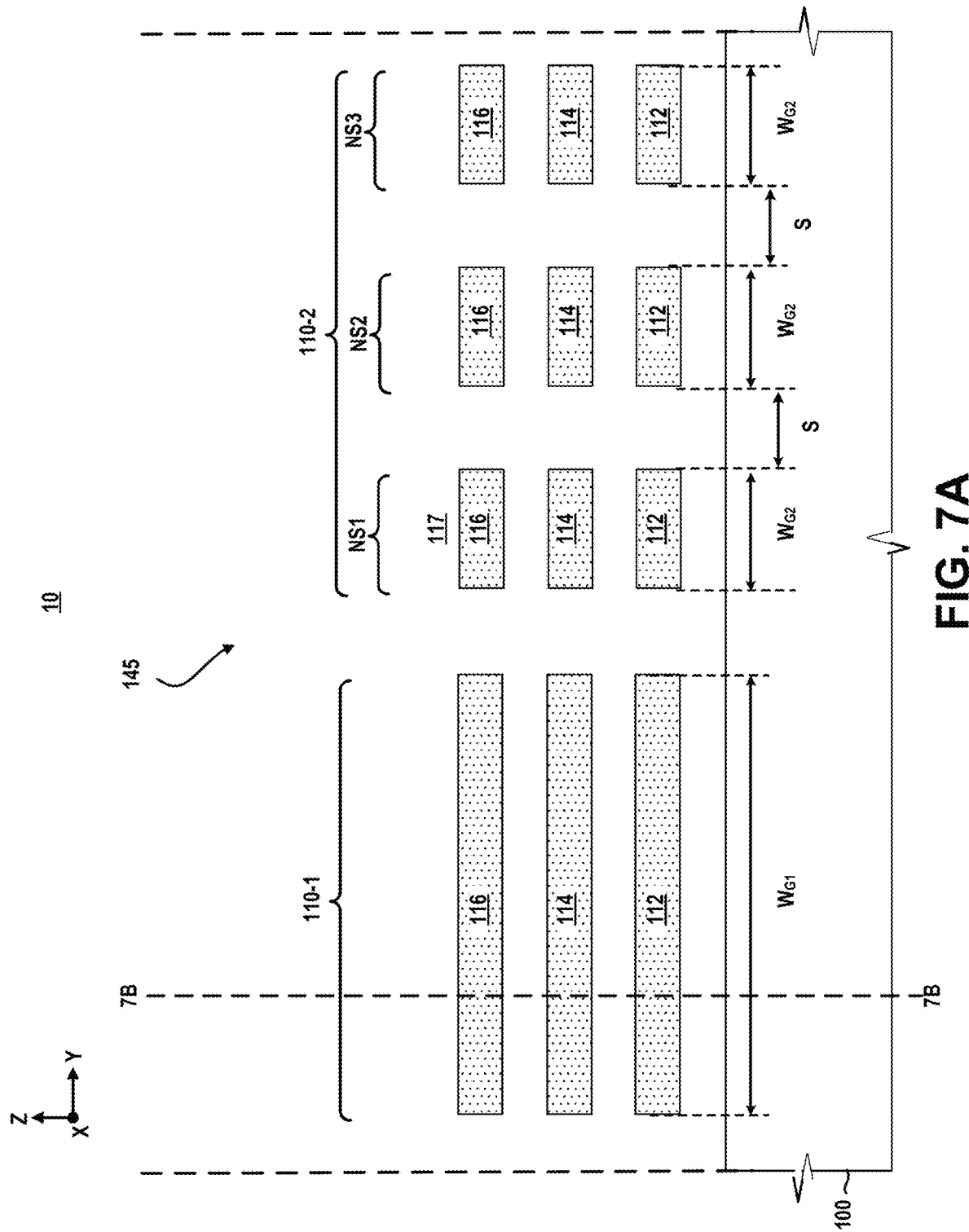

CHANNEL ORIENTATION OF CMOS GATE-ALL-AROUND FIELD-EFFECT TRANSISTOR DEVICES FOR ENHANCED CARRIER MOBILITY

TECHNICAL FIELD

This disclosure relates generally to semiconductor fabrication techniques and, in particular, to techniques for fabricating complementary metal-oxide-semiconductor (CMOS) gate-all-around (GAA) field-effect transistor (FET) devices such as nanosheet FET devices.

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor channel layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In GAA FET devices such as nanowire/nanosheet FET devices, the gate material is formed to surround all sides of the active channel layers of such FET devices in the stacked configuration, thereby increasing the FET device width (or channel width), and thus the drive current, for a given footprint area.

One issue with GAA FET devices such as nanosheet FET devices is that different crystal plane orientations of the channel layers contribute to the transport of carriers (e.g., electrons and holes). However, this results in design challenges due to the fact that the interface properties of the different surfaces (e.g., top, bottom and side surfaces) of the active channel layers (e.g., nanosheet channel layers) can vary and be significantly different as a result of the different crystal orientations of the channel surfaces (e.g., charge distribution and carrier mobility properties are different for each crystal orientation). Consequently, device performance can degrade due to decreased carrier mobility and interface traps along the surfaces of the active channel layers.

SUMMARY

Embodiments of the invention include semiconductor integrated circuit devices comprising nanosheet field-effect transistor devices, wherein the channel orientation layout of N-type and P-type nanosheet field-effect transistor devices are independently configured to provide enhanced carrier mobility in the channel layers of the different type nanosheet field-effect transistor devices.

For example, an exemplary embodiment includes a semiconductor integrated circuit device which comprises a first-type nanosheet field-effect transistor device and a second-type nanosheet field-effect transistor device disposed on a semiconductor substrate. The first-type nanosheet field-effect transistor device comprises a first nanosheet stack structure comprising a stack of nanosheet channel layers, wherein each nanosheet channel layer of the first nanosheet stack structure comprises a first channel width. The second-type nanosheet field-effect transistor device comprises a second nanosheet stack structure comprising at least a first stack of nanosheet channel layers and a second stack of nanosheet channel layers. The first and second stacks of nanosheet channel layers are disposed adjacent to and spaced apart from each other. Each nanosheet channel layer of the first and second stacks of nanosheet channel layers comprises a second channel width, which is less than the first channel width. Horizontal surfaces of the nanosheet channel layers of the first and second nanosheet stack structures are aligned with a first crystal plane of the nanosheet channel layers, which provides a greater carrier mobility of a first type of carrier over a second type of carrier. Vertical surfaces of the nanosheet channel layers of the first and second nanosheet stack structures are aligned with a second crystal plane of the nanosheet channel layers, which provides a greater carrier mobility of the second type of carrier over the first type of carrier.

In one embodiment, the first-type nanosheet field-effect transistor device comprises a N-type nanosheet field-effect transistor device, the second-type nanosheet field-effect transistor device comprises a P-type nanosheet field-effect transistor device, the first type of carrier comprises electrons, and the second type of carrier comprises holes.

In one embodiment, the first crystal plane comprises a <100> crystal plane, and wherein the second crystal plane comprises a <110> crystal plane.

In another embodiment, a method of fabricating a semiconductor integrated circuit device comprises: forming a nanosheet layer stack over a semiconductor substrate; patterning the nanosheet layer stack to thereby form (i) a first nanosheet stack structure of a first-type nanosheet field-effect transistor device and (ii) a second nanosheet stack structure of a second-type nanosheet field-effect transistor device; forming a common gate structure which surrounds the first and second nanosheet stack structures; and forming source/drain layers in contact with end portions of the nanosheet channel layers of the first and second nanosheet stack structures. The first nanosheet stack structure is formed to include a stack of nanosheet channel layers, wherein each nanosheet channel layer of the first nanosheet stack structure comprises a first channel width. The second nanosheet stack structure is formed to include at least a first stack of nanosheet channel layers and a second stack of nanosheet channel layers, wherein the first and second stacks of nanosheet channel layers are disposed adjacent to and spaced apart from each other, and wherein each nanosheet channel layer of the first and second stacks of nanosheet channel layers comprises a second channel width, which is less than the first channel width. The horizontal surfaces of the nanosheet channel layers of the first and second nanosheet stack structures are aligned with a first crystal plane of the nanosheet channel layers, which provides a greater carrier mobility of a first type of carrier over a second type of carrier, and the vertical surfaces of the nanosheet channel layers of the first and second nanosheet stack structures are aligned with a second crystal plane of the nanosheet channel layers, which provides a greater carrier mobility of the second type of carrier over the first type of carrier.

Other embodiments will be described in the following detailed description of embodiments, which is to be read in conjunction with the accompanying figures.

BRIEF DESCRIPTION OF THE DRAWINGS

FIGS. 1A, 1B, and 1C are schematic views of a semiconductor integrated circuit (IC) device comprising CMOS nanosheet FET devices, wherein the channel orientation layout of P-type and N-type nanosheet FET devices are independently configured to provide enhanced carrier mobility, according to an exemplary embodiment of the invention, wherein:

FIG. 1A is a schematic top plan view of the semiconductor IC device comprising a N-type nanosheet device and a P-type nanosheet device;

FIG. 1B is a schematic cross-sectional side view of the semiconductor IC device along line 1B-1B shown in FIG. 1A, which illustrates a structure of the N-type nanosheet FET device and the P-type nanosheet FET devices along gate width directions of the N-type and P-type nanosheet FET devices; and FIG. 1C is a schematic cross-sectional side view of the semiconductor IC device along line 1C-1C shown in FIG. 1A, which illustrates a structure of the N-type nanosheet FET device along a gate length direction of the N-type nanosheet FET device.

FIGS. 2-8B schematically illustrate a method for fabricating a semiconductor IC device comprising CMOS nanosheet FET devices, wherein the channel orientation layout of P-type and N-type nanosheet FET devices are independently configured to provide enhanced carrier mobility in the channel layers the nanosheet FET devices, according to an exemplary embodiment of the invention, wherein:

FIG. 2 is a schematic cross-sectional side view of the semiconductor device at an initial stage of fabrication comprising a semiconductor substrate and a nanosheet layer stack formed over the semiconductor substrate;

FIG. 5A is a schematic cross-sectional side view of the device structure of FIG. 4C after forming embedded gate sidewall spacers within sidewalls of the nanosheet stack structures of the N-type and P-type nanosheet FET devices;

FIG. 7A is a schematic cross-sectional view of the device structure shown in FIGS. 6A and 6B after removing the dummy gate structure and after removing sacrificial nanosheet layers to release active nanosheet channel layers of the nanosheet stack structures of the N-type and P-type nanosheet FET devices;

FIG. 8B is a schematic cross-sectional side view of the device structure along line 8B-8B shown in FIG. 8A.

DETAILED DESCRIPTION

Figure 1A:
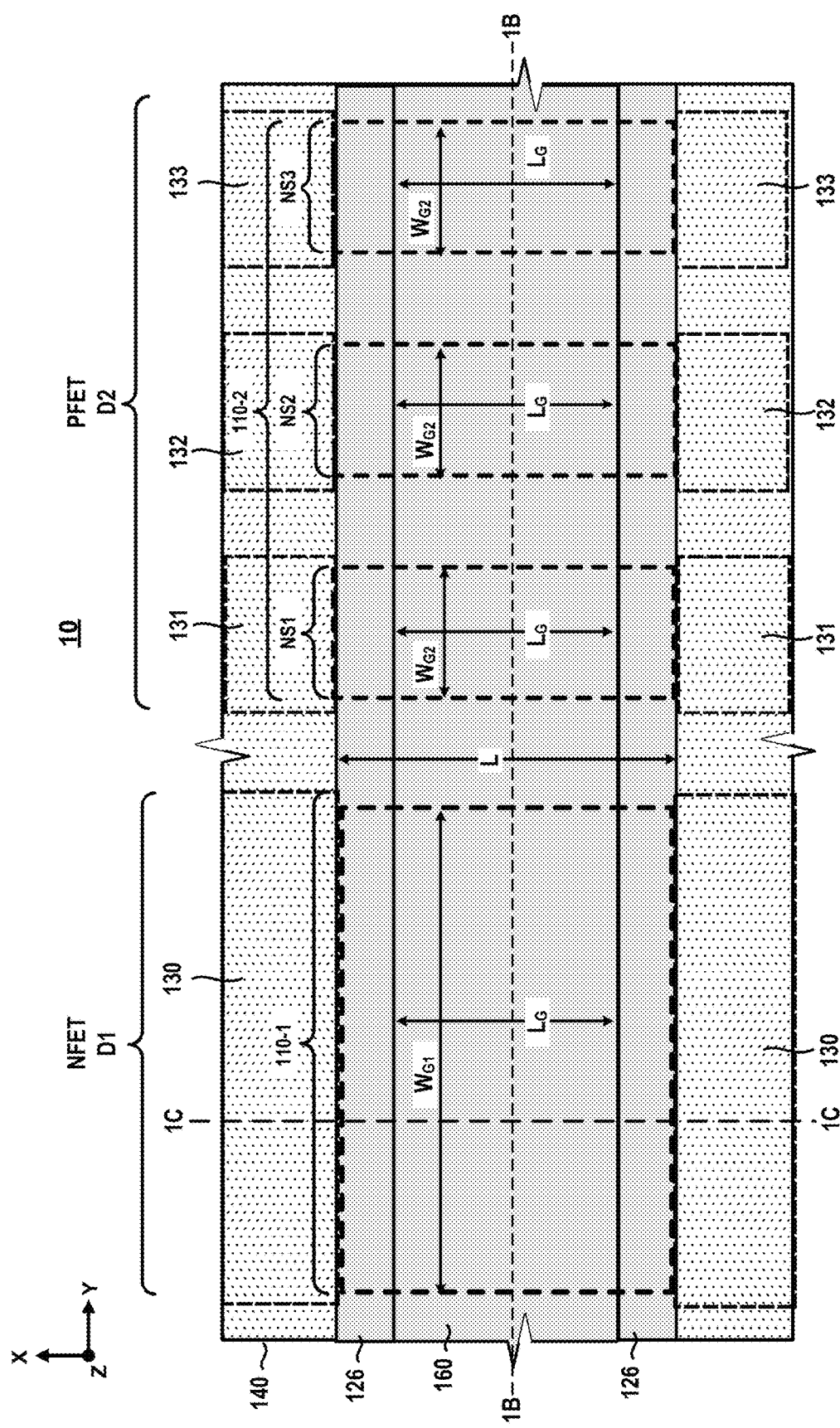

Embodiments of the invention will now be described in further detail with regard to methods for fabricating semiconductor IC devices comprising CMOS FET devices (e.g., nanosheet FET devices), wherein the channel orientation layout of N-type and P-type FET devices are independently configured to provide enhanced carrier mobility in the channel layers of the FET devices. For illustrative purposes, exemplary embodiments of the invention will be discussed in the context of nanosheet FET devices, but it is to be understood that the fabrication techniques discussed herein are readily applicable to various types of gate-all-around FET devices having gate structures that are formed around all sides of active channel layers.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g. the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
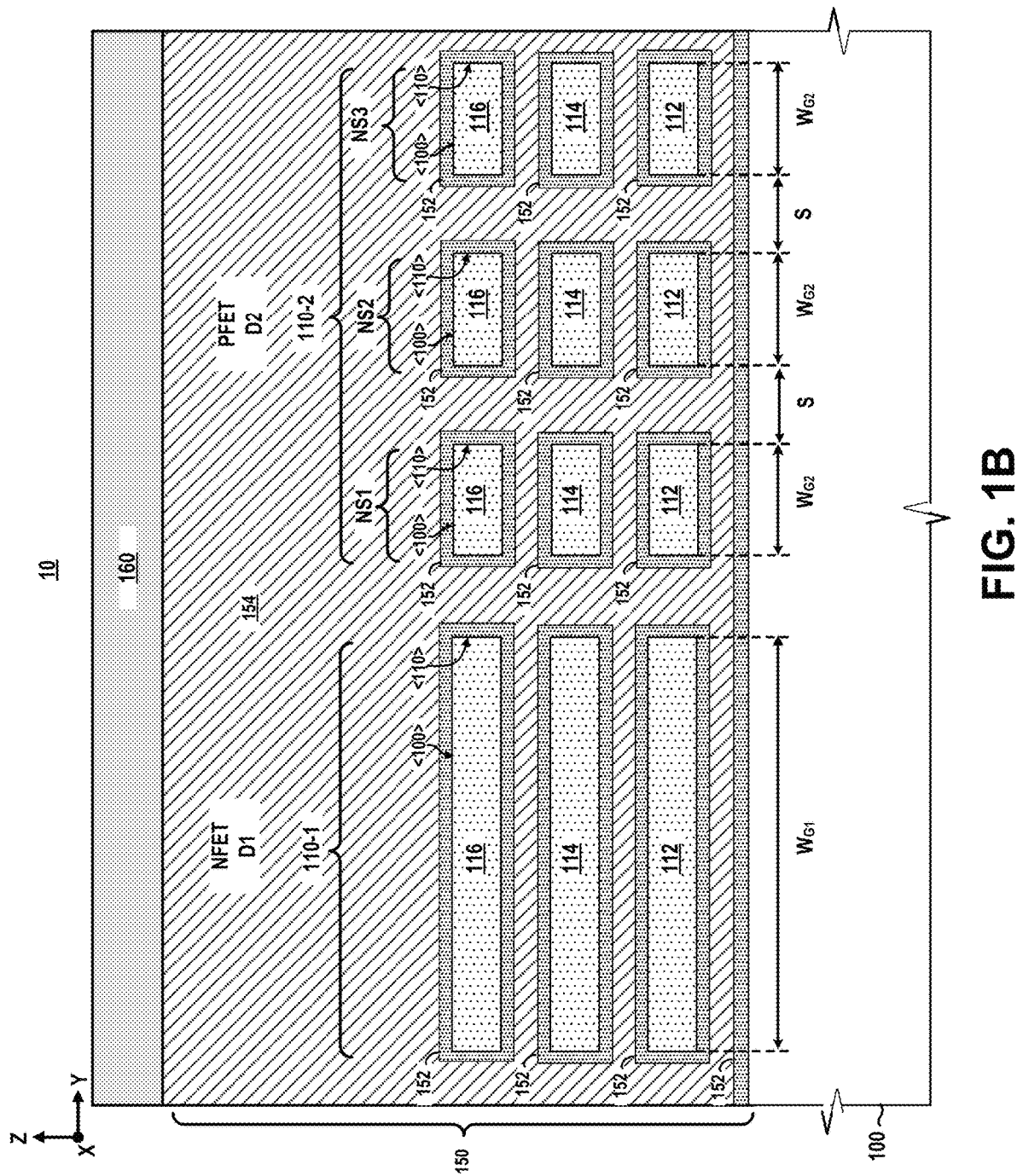
Figure 1C:
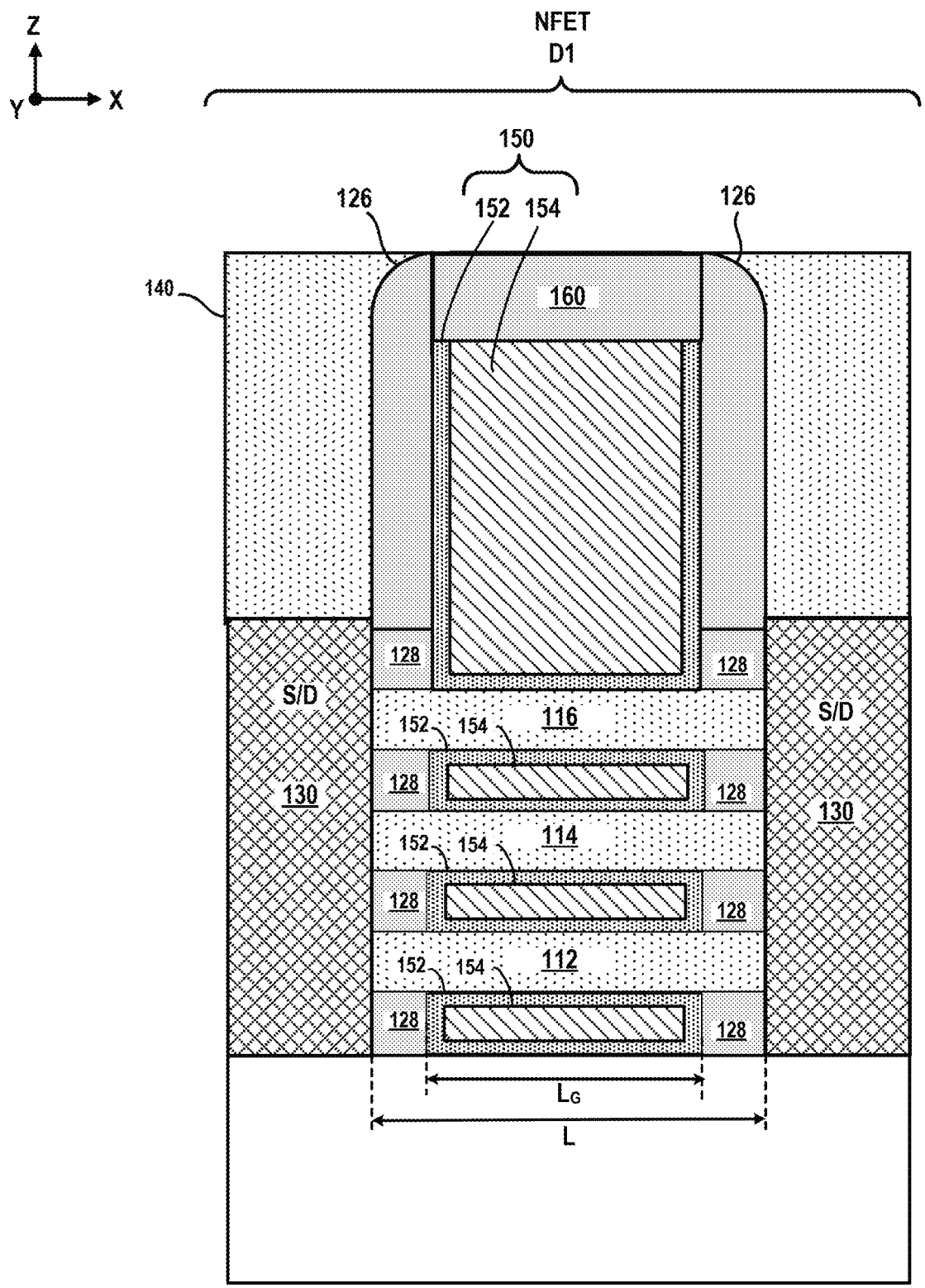

FIGS. 1A, 1B, and 1C are schematic views of a semiconductor IC device 10 comprising CMOS nanosheet FET devices, wherein the channel orientation layout of P-type and N-type nanosheet FET devices are independently configured to provide enhanced carrier mobility, according to an exemplary embodiment of the invention. In particular, FIG. 1A is a schematic top plan view (X-Y plan view) of the semiconductor IC device 10 comprising a N-type nanosheet device D1 and a P-type nanosheet device D2. FIG. 1B is a schematic cross-sectional side view (Y-Z plane) of the semiconductor IC device 10 along line 1B-1B shown in FIG. 1A, and FIG. 1C is a schematic cross-sectional side view (X-Z plane) of the semiconductor IC device 10 along line 1C-1C shown in FIG. 1A. FIG. 1B schematically illustrates the structure of the nanosheet FET devices D1 and D2 along a gate width $W_{G1}$ and $W_{G2}$ direction of the nanosheet FET devices D1 and D2. FIG. 1C schematically illustrates the structure of the nanosheet FET device D1 along a gate length $L_G$ direction of the nanosheet FET device D1.

As schematically illustrated in FIGS. 1A, 1B and 1C, the N-type nanosheet FET device D1 the P-type nanosheet FET device D2 are formed on a substrate 100. The N-type nanosheet FET device D1 comprises a nanosheet stack structure 110-1 comprising a stack of active nanosheet channel layers 112, 114, and 116, and source/drain (S/D) layers 130 connected to end portions of the active nanosheet channel layers 112, 114, and 116. The P-type nanosheet FET device D2 comprises a nanosheet stack structure 110-2 comprising a plurality of nanosheet stacks NS1, NS2, and NS3 and respective source/drain layers 131, 132 and 133. The nanosheet stacks NS1, NS2 and NS3 each comprise a stack of active nanosheet channel layers 112, 114, and 116 connected to the respective source/drain layers 131, 132, and 133. The source/drain layers 130, 131, 132, and 133 are encapsulated in an insulating layer 140 comprised of dielectric material. It is to be understood that the term "source/drain layer" as used herein means that a given source/drain layer can be either a source or drain of an FET device, depending on the application or circuit configuration.

The nanosheet FET devices D1 and D2 comprise a common gate structure which comprises a high-k dielectric/metal gate (HKMG) structure 150, sidewall spacers 126, embedded sidewall spacers 128, and a gate capping layer 160. The HKMG structure 150 comprises gate dielectric layers 152 formed over surfaces of the active nanosheet channel layers 112, 114 and 116 of the nanosheet stack structures 110-1 and 110-2, and a common metal gate electrode layer 154. The gate dielectric layers 152 comprise one or more conformally deposited layers of high-k dielectric material (e.g., HfO2, HfSiO, HfZrO, and/or nitrided films thereof). In some embodiments, the common metal gate electrode layer 154 comprises one or more work function metal (WFM) layers to tune the threshold voltage for the nanosheet FET devices, and a low-resistance metal layer (e.g., tungsten, cobalt, ruthenium, etc.) that fills the gate region to form a metal gate electrode.

As schematically illustrated in FIGS. 1B and 1C, the HKMG structure 150 surrounds all sides (top, bottom, sidewalls) of the active channel layers 112, 114, and 116 to provide a GAA FET structure. The sidewall spacers 126 and embedded sidewall spacers 128 surround the HKMG structure 150 to define a common gate region of the N-type and P-type nanosheet FET devices D1 and D2. The sidewall spacers 126, the embedded sidewall spacers 128, and the gate capping layer 160 serve to electrically insulate the HKMG structure 150 from surrounding elements (e.g., the source/drain layers 130, 131, 132, and 133, the insulating layer 140, vertical source/drain contacts, etc.). The exemplary embodiment of FIGS. 1A-1C illustrates a CMOS inverter comprising an N-type FET device and P-type FET device with a common gate connection.

The active nanosheet channel layers 112, 114, and 116 of the nanosheet FET devices D1 and D2 are formed of an epitaxial semiconductor material (e.g., epitaxial silicon) and have a same thickness (in the Z-direction). Further, as shown in FIGS. 1A and 1C, the active nanosheet channel layers 112, 114, and 116 of the nanosheet FET devices D1 and D2 have a same length L, and the portions of the active nanosheet channel layers 112, 114 and 116 which are overlapped/surrounded by the HKMG structure 150 define the gate length $L_G$ (or channel length) of the active nanosheet channel layers 112, 114, and 116. Furthermore, as shown in FIGS. 1A and 1B, the active nanosheet channel layers 112, 114, and 116 of the nanosheet stack structure 110-1 of the N-type nanosheet FET device D1 have a first gate width $W_{G1}$ (or first channel width) and the active nanosheet channel layers 112, 114, and 116 of the nanosheet stacks NS1, NS2, and NS3 of the P-type FET device D2 have a second gate width $W_{G2}$ (or second channel width). The second gate width $W_{G2}$ is less than the first gate width $W_{G1}$. The nanosheet stacks NS1, NS2, and NS3 are separated by a spacing S.

As further shown in FIG. 1B, the horizontal surfaces (X-Y plane) of the active nanosheet channel layers 112, 114, and 116 of the nanosheet FET devices D1 and D2 are aligned with a <100> crystal orientation (or crystal plane) of the active nanosheet channel layers 112, 114, and 116. In addition, the vertical surfaces (X-Z plane) of the active nanosheet channel layers 112, 114, and 116 are aligned with a <110> crystal orientation of the active nanosheet channel layers 112, 114, and 116. As is known in the art, the crystal orientation of wafers and semiconductor layers have regular crystal structures, wherein the surfaces of wafers and semiconductor layers are aligned with one of several relative directions, known as the orientation, which are classified using Miller indices (e.g., <100>, <111>, and <110>).

The different crystal planes have different arrangements of atoms and lattices which affect the carrier mobility. The term carrier mobility refers in general to both electron mobility and hole mobility. With semiconductor material, the electron mobility characterizes how fast an electron can move though the semiconductor material in the presence of an electric field. In addition, hole mobility characterizes how fast a hole can move through the semiconductor material in the presence of an electric field.

With the N-type nanosheet FET device D1, the <100> and <110> crystal orientations both contribute to the transport of electrons along the lengths L of the active nanosheet channel layers 112, 114, and 116 of the nanosheet stack structure 110-1. In addition, with the P-type nanosheet FET device D2, the <100> and <110> crystal orientations both contribute to the transport of holes along the lengths L of the active nanosheet channel layers 112, 114, and 116 of the nanosheet stack structure 110-2. However, electron mobility is higher on the <100> surface orientation (as compared to electron mobility on the <110> surface orientation), and hole mobility is higher on the <110> surface orientation (as compared to hole mobility on the <100> surface orientation).

In this regard, in accordance with exemplary embodiments of the invention, the structural configuration and layout of the nanosheet stack structures 110-1 and 110-2 are designed to enhance carrier mobility in the different type nanosheet FET devices D1 and D2. In particular, for the N-type nanosheet FET device D1, the nanosheet stack structure 110-1 is designed maximize the surface area of the <100> crystal orientation of the active nanosheet channel layers 112, 114, and 116 of the nanosheet stack structure 110-1 to optimize electron mobility in the N-type nanosheet FET device D1. In addition, for the P-type nanosheet FET device D2, the nanosheet stack structure 110-2 is designed maximize the surface area of the <110> crystal orientation of the active nanosheet channel layers 112, 114, and 116 of the nanosheet stack structure 110-2 to optimize hole mobility in the P-type nanosheet FET device D2.

By way of example, assume that the active nanosheet channel layers 112, 114, and 116 of the nanosheet stack structure 110-1 of the N-type nanosheet FET device D1 have a first gate width $W_{G1}=50$ nm and a thickness of 5 nm. In this exemplary embodiment, the N-type nanosheet FET device D1 would have a total effective gate width, $W_{G1\_eff\_total}=$ ($W_{eff}$ of <100> surfaces)+($W_{eff}$ of <110> surfaces)=(6×50 nm)+(6×5 nm)=300 nm+30 nm=330 nm. For the N-type nanosheet device D1, the effective gate width of the <100> surfaces (e.g., 300 nm) is significantly greater than the effective gate width of the <110> surfaces (e.g., 30 nm). This serves to maximize electron mobility of the N-type nanosheet FET device D1 due to the majority of the electron transport surface being aligned with the <100> crystal plane orientation.

In a conventional design, the N-type and P-type nanosheet FET devices D1 and D2 would have nanosheet stack structures with the same configuration, size, layout, etc. For example, in a conventional design, the N-type and P-type nanosheet FET devices D1 and D2 would have the same nanosheet stack structure 110-1 as the N-type nanosheet FET device D1 shown in FIG. 1B. In this instance, based on the above example embodiment, the P-type nanosheet device D2 would have an effective gate width of 300 nm for the <100> surfaces an effective gate width of 30 nm for the <110> surfaces. However, with such conventional design, the hole mobility of a P-type nanosheet device is not optimized given the relatively larger surface area of the <100> channel orientation as compared to the smaller surface area of the <110> channel orientation.

In the exemplary embodiment of FIGS. 1A-1C, the nanosheet stack structure 110-2 of the P-type nanosheet FET device D2 is designed with multiple smaller width stacks (e.g., three nanosheet stacks NS1, NS2, and NS3) to achieve an effective increase the surface area of the <110> channel orientation of the active nanosheet channel layers 112, 114, and 116. The effective increase in the surface area of the <110> channel orientation of the active nanosheet channel layers 112, 114, and 116 of the nanosheet stack structure 110-2 serves to enhance the carrier mobility of the P-type nanosheet FET device D2 as result of increased area of the hole transport surface being aligned with the <110> crystal plane orientation.

For example, assume in the exemplary embodiment shown in FIG. 1B that the active nanosheet channel layers 112, 114, and 116 of the nanosheet stacks NS1, NS2 and NS3 have a second gate width $W_{G2}=13$ nm and a thickness of 5 nm, and that the spacing S between the nanosheet stacks NS1, NS2, and NS3 is S=5 nm. In this exemplary embodiment, the P-type nanosheet FET device D2 would have a total effective gate width, $W_{G2\_eff\_total}=$($W_{eff}$ of <100> surfaces)+($W_{eff}$ of <110> surfaces)=(18×13 nm)+(18×5 nm)=234 nm+90 nm=324 nm. In this exemplary embodiment, $W_{G2\_eff\_total}=324$ of the P-type nanosheet FET device D2 would be similar to $W_{G1\_eff\_total}=330$ of the N-type nanosheet FET device D1 (and a conventional channel structure and configuration of a P-type nanosheet device), while providing increase hole mobility as compared to a conventional nanosheet stack structure of the P-type device.

Indeed, the effective gate width $W_{eff}$ (e.g., 90 nm) of the <110> surfaces of the P-type nanosheet FET device D2 is greater than the effective gate width $W_{eff}$ (e.g., 30 nm) of the <110> surfaces the N-type nanosheet device D1. The increased area of the <110> surfaces serves to increase the hole mobility of the P-type device D2. For example, with the exemplary dimensions discussed above for the nanosheet stack structures 110-1 and 110-2, the structure and layout of the nanosheet stack structure 110-2 provides about a 25% increase in the hole mobility of the P-type nanosheet device D2, as compared the structure and layout of the nanosheet stack structure 110-1 if utilized for the P-type device D2.

Furthermore, in some embodiments, the increase in hole mobility for the P-type nanosheet FET device D2 is achieved using a structure and layout of the nanosheet stack structure 110-2 having multiple nanosheet stacks NS1, NS2 and NS3, but without having to increase the footprint area occupied by the P-type nanosheet FET device D2. Indeed, in the exemplary embodiment discussed above, the footprint area A1 of the nanosheet stack structure 110-1 of the N-type device D1 would be A1=($W_{G1}$×L) nm², while the footprint area A2 of the nanosheet stack structure 110-2 of the P-type device D2 would be A2=[(3×$W_{G2}$+2×S)×L] nm². For example, assume that the length L of all active channel layers 112, 114 and 116 (in the X-direction) is the same for the N-type and P-type nanosheet FET devices D1 and D2, and that $W_{G1}=50$ nm, $W_{G2}=13$ nm, and that S=5 nm. In this exemplary embodiment, we see that the footprint area A1 of the nanosheet stack structure 110-1 of the N-type device D1 would be A1=(50×L) nm², while the footprint area A2 of the nanosheet stack structure 110-2 of the P-type device D2 would be A2=[(3×13 nm)+2×5 nm)×L] nm², i.e., A2=(49×L) nm², which is substantially similar (e.g., slightly less) than the footprint area A1.

It is to be understood that the various sizes noted above are provided for illustrative purposes. In other embodiments, first channel width $W_{G1}$ can be in a range of about 50 nm to about 80 nm, and the second channel width $W_{G2}$ can be in a range of about 10 nm to about 20 nm. In addition, the spacing S can be more than 5 nm. In addition, while the nanosheet stack structure 110-2 of the P-type nanosheet device D2 is shown to include three constituent nanosheet stacks NS1, NS2 and NS3, in other embodiments, a P-type nanosheet FET device may include 2, 4 or more constituent nanosheet stacks.

FIGS. 2-8B schematically illustrate a method for fabricating a semiconductor IC device comprising CMOS nanosheet FET devices, wherein the channel orientation layout of P-type and N-type nanosheet FET devices are independently configured to provide enhanced carrier mobility in the channel layers the nanosheet FET devices, according to an exemplary embodiment of the invention. In particular, for illustrative purposes, FIGS. 2-8B schematically illustrate a method for fabricating the semiconductor IC device 10 as shown in FIGS. 1A, 1B, and 1C. To begin, FIG. 2 is a schematic cross-sectional side view (Y-Z plane) of the semiconductor IC device 10 at an initial stage of fabrication comprising a semiconductor substrate 100 (e.g., wafer), and a nanosheet layer stack 110 formed over the semiconductor substrate 100. While the semiconductor substrate 100 is illustrated as a generic substrate layer for ease of illustration, it is to be understood that the semiconductor substrate 100 may comprise one of different types of semiconductor substrate structures and materials.

For example, in one embodiment, the semiconductor substrate 100 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In other embodiments, the semiconductor substrate 100 may be an SOI (silicon-on-insulator) substrate, a GeOI (germanium-on-insulator) substrate, or other types of semiconductor-on-insulator substrates, which comprise an insulating layer (e.g., oxide layer) disposed between a base substrate layer (e.g., silicon substrate) and an active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 100 (e.g., wafer) being processed.

The nanosheet layer stack 110 comprises a plurality of epitaxial semiconductor layers 111, 112, 113, 114, 115, 116, and 117 which are sequentially grown over the surface of the semiconductor substrate 100. In particular, the nanosheet layer stack 110 comprises sacrificial nanosheet layers 111, 113, 115, and 117, and active nanosheet channel layers 112, 114, and 116, wherein each active nanosheet channel layer 112, 114, and 116 is disposed between sacrificial nanosheet layers in the nanosheet layer stack 110. The sacrificial nanosheet layer 111 is epitaxially grown on the surface of the semiconductor substrate 100, the active nanosheet channel layer 112 is epitaxially grown on the sacrificial nanosheet layer 111, the sacrificial nanosheet layer 113 is epitaxially grown on the active nanosheet channel layer 112, the active nanosheet channel layer 114 is epitaxially grown on the sacrificial nanosheet layer 113, the sacrificial nanosheet layer 115 is epitaxially grown on the active nanosheet channel layer 114, the active nanosheet channel layer 116 is epitaxially grown on the sacrificial nanosheet layer 115, and the sacrificial nanosheet layer 117 is epitaxially grown on the active nanosheet channel layer 116.

In one embodiment, the epitaxial semiconductor layers 111-117 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The type of materials that are utilized to form the epitaxial semiconductor layers 111-117 will depend on the application.

For example, in one embodiment, the active nanosheet channel layers 112, 114, and 116 are formed of crystalline epitaxial silicon (Si). When the active nanosheet channel layers 112, 114, and 116 are formed of crystalline epitaxial Si, the sacrificial nanosheet layers 111, 113, 115, and 117 (which serve as sacrificial layers that are subsequently etched away to release the active nanosheet channel layers 112, 114, and 116), can be formed of an epitaxial silicon-germanium (SiGe) alloy. This allows the epitaxial SiGe material of the sacrificial nanosheet layers 111, 113, 115, and 117 to be etched selective to the epitaxial Si material of the semiconductor channel layers 112, 114, and 116 in a subsequent process step to "release" the active nanosheet channel layers 112, 114, and 116. In other embodiments, the active nanosheet channel layers 112, 114, and 116 can be formed of an epitaxial SiGe material with a desired Ge concentration (optimized for device performance), and the sacrificial nanosheet layers 111, 113, 115, and 117 can be formed of a sacrificial semiconductor material (e.g., Si) that can be etched selective to the active nanosheet channel layers 112, 114, and 116. While the nanosheet layer stack 110 is shown to include three active nanosheet channel layers 112, 114, and 116, in other embodiments of the invention, the nanosheet layer stack 110 can be fabricated with more or less than three active nanosheet channel layers.

As shown in FIG. 2, the sacrificial nanosheet layers 111, 113, 115, and 117 are formed with a thickness T1, and the active nanosheet channel layers 112, 114, and 116 are formed with a thickness T2. The thickness T1 of the sacrificial nanosheet layers 111, 113, 115, and 117 defines the spacing size (or channel spacing) above and below the active nanosheet channel layers 112, 114, and 116, in which high-k dielectric material and work function metal is formed. The spacing size (e.g., T1) and the type of WFM material(s) disposed in the spaces above and below the active nanosheet channel layers 112, 114, and 116 defines, in part, the threshold voltage (Vt) of the nanosheet FET device. In one embodiment, the thickness T1 of the sacrificial nanosheet layers 111, 113, 115, and 117 is in a range of about 8 nm to about 10 nm.

The thickness T2 of the semiconductor layers 112, 114, and 116 defines a thickness of the active nanosheet channel layers of the nanosheet FET devices. The thickness T2 of the active nanosheet channel layers defines, in part, the threshold voltage (Vt) of the nanosheet FET devices (e.g., Vt increases with decreasing channel thickness). In one embodiment, the thickness T2 of the active nanosheet channel layers 112, 114, and 116 is in a range of about 5 nm to about 7 nm, although the active nanosheet channel layers 112, 114, and 116 can be formed with other thickness ranges, depending on the application.

Figure 3A:
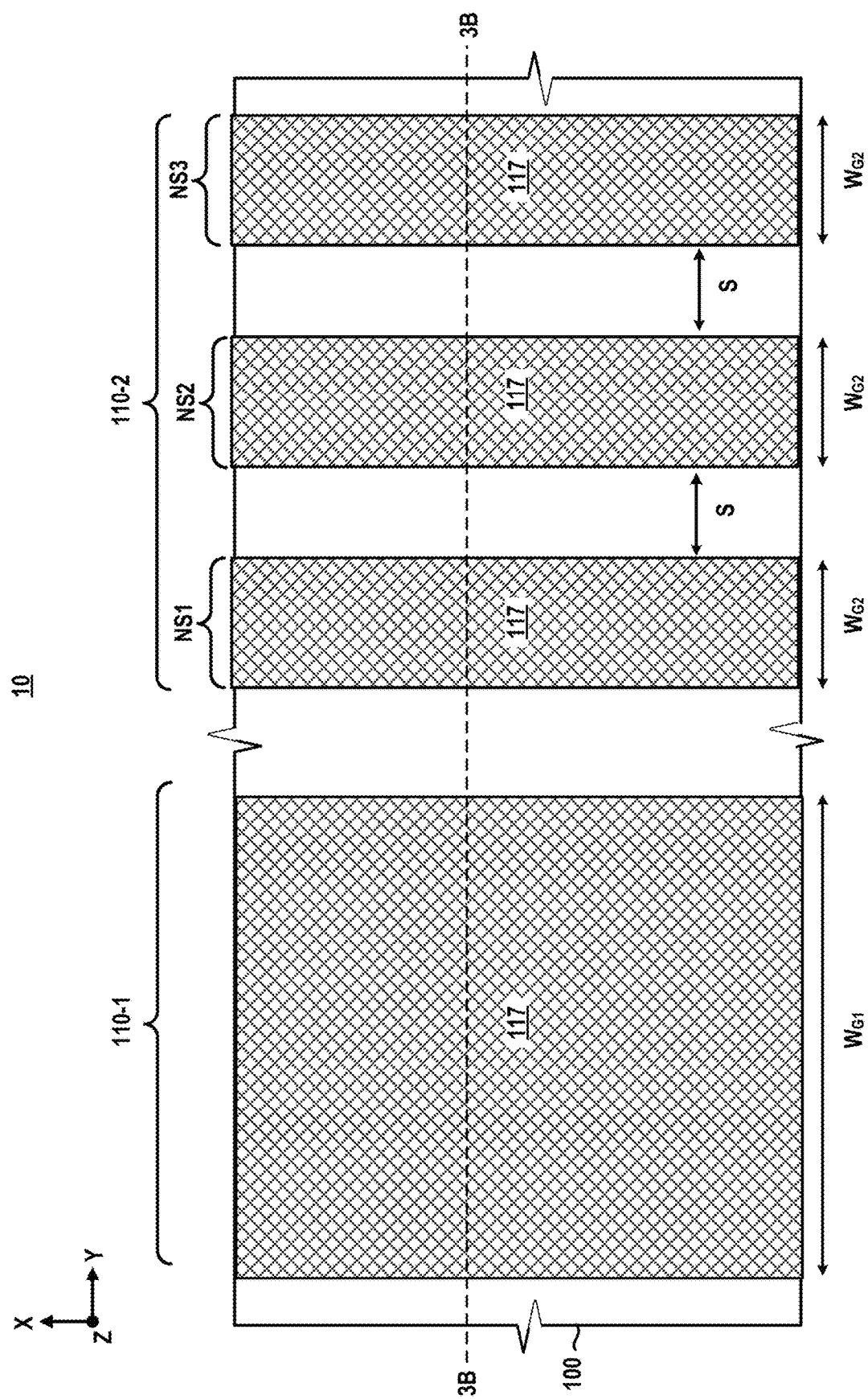
FIG. 3A is a schematic top plan view of the device structure shown FIG. 2 after patterning the nanosheet layer stack to define a nanosheet stack structure for an N-type nanosheet FET device, and a nanosheet stack structure for a P-type FET device.
Figure 3B:
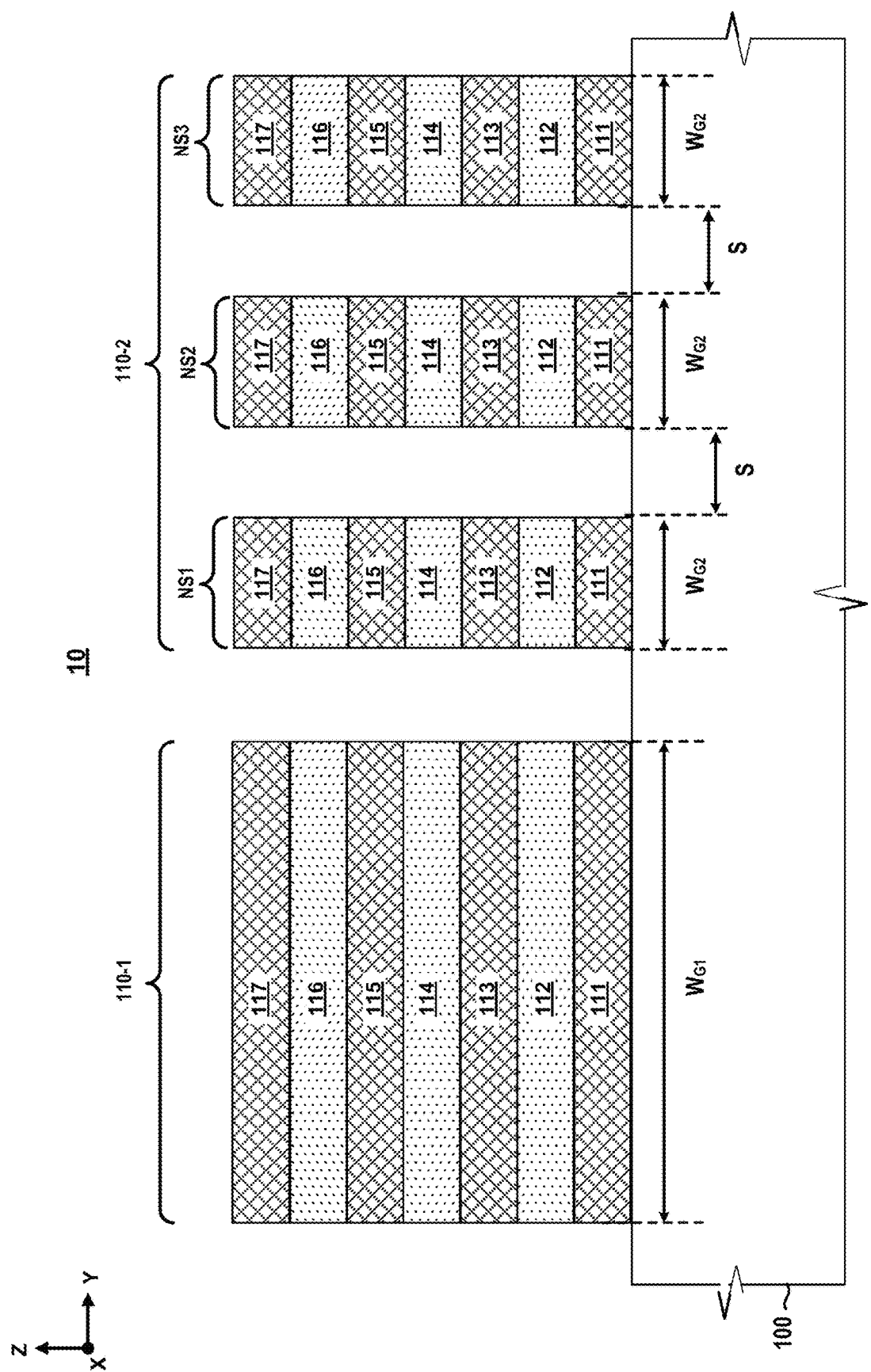
FIG. 3B is a schematic cross-sectional side view of the device structure along line 3B-3B shown in FIG. 3A.

A next phase of the process flow comprises patterning the nanosheet layer stack 110 to define nanosheet stack structures for the nanosheet FET devices that are formed in various regions of the semiconductor substrate 100. For example, FIGS. 3A and 3B are schematic views of the semiconductor IC device of FIG. 2 after patterning the nanosheet layer stack 110 to define, in part, the nanosheet stack structure 110-1 of the N-type nanosheet FET device D1 (with a defined gate width $W_{G1}$) and the separate nanosheet stacks NS1, NS2, and NS3 of the nanosheet stack structure 110-2 of the P-type FET device D2 (width defined gate widths $W_{G2}$ and spacing S). In particular, FIG. 3A is a schematic top plan view (X-Y plane) of the device structure, and FIG. 3B is a schematic cross-sectional side view (Y-Z plane) of the device structure along line 3B-3B shown in FIG. 3A. As shown in FIGS. 3A and 3B, the patterning process results in (i) defining the gate width $W_{G1}$ of the active nanosheet channel layers 112, 114, and 116 of the nanosheet stack structure 110-1 of the N-type nanosheet FET device, (ii) defining the gate width $W_{G1}$ of the active nanosheet channel layers 112, 114, and 116 of the nanosheet stacks NS1, NS2, and NS3 of the nanosheet stack structure 110-2 of the P-type FET device D2, and (iii) defining the spacing S between the nanosheet stacks NS1, NS2, and NS3.

In one embodiment, the patterning process is performed by forming an etch mask (e.g., a lithographic mask) on the nanosheet layer stack 110, wherein the etch mask comprises an image of the elongated nanosheet stack structures 110-1 and 110-2 to be transferred into the nanosheet layer stack 110 using dry etch process (e.g., reactive ion etching (RIE)). The etch mask can be formed using any suitable patterning process including, but not limited to, a photolithography process, or a multi-patterning process such as a sidewall image transfer (SIT) process, a self-aligned double patterning (SADP) process, a self-aligned quadruple pattering (SAQP), etc. The etching can be performed using one or more sequential dry etch processes with etch chemistries that are suitable to etch the materials of semiconductor layers 111-117.

Although not shown in the Figures, an isolation layer (e.g., shallow trench isolation (STI) layer) can be formed at this stage of fabrication. For example, as part of the patterning process which results in the device structure shown in FIGS. 3A and 3B, the exposed portion of the upper surface of the semiconductor substrate 100 can be recessed to a target depth to form trenches in the semiconductor substrate 100 which surround the nanosheet stack structures 110-1 and 110-2. The trenches are then filled with an insulating material to form STI layers. In one embodiment, the STI layers are formed by a process which comprises depositing a layer of insulating material over the surface of the semiconductor structure to cover the nanosheet stack structures 110-1 and 110-2, planarizing the surface of the semiconductor structure (via chemical mechanical polishing (CMP)) down to an upper surface of the nanosheet stack structures 110-1 and 110-2 to remove the overburden insulating material, and then performing an etch-back (or recess) process to recess the remaining layer of insulating material down to a target level which defines a thickness of the STI layer. The STI layers can be formed of any type of insulating material, such a silicon oxide material, which is suitable for the given fabrication process flow.

Figure 4A:
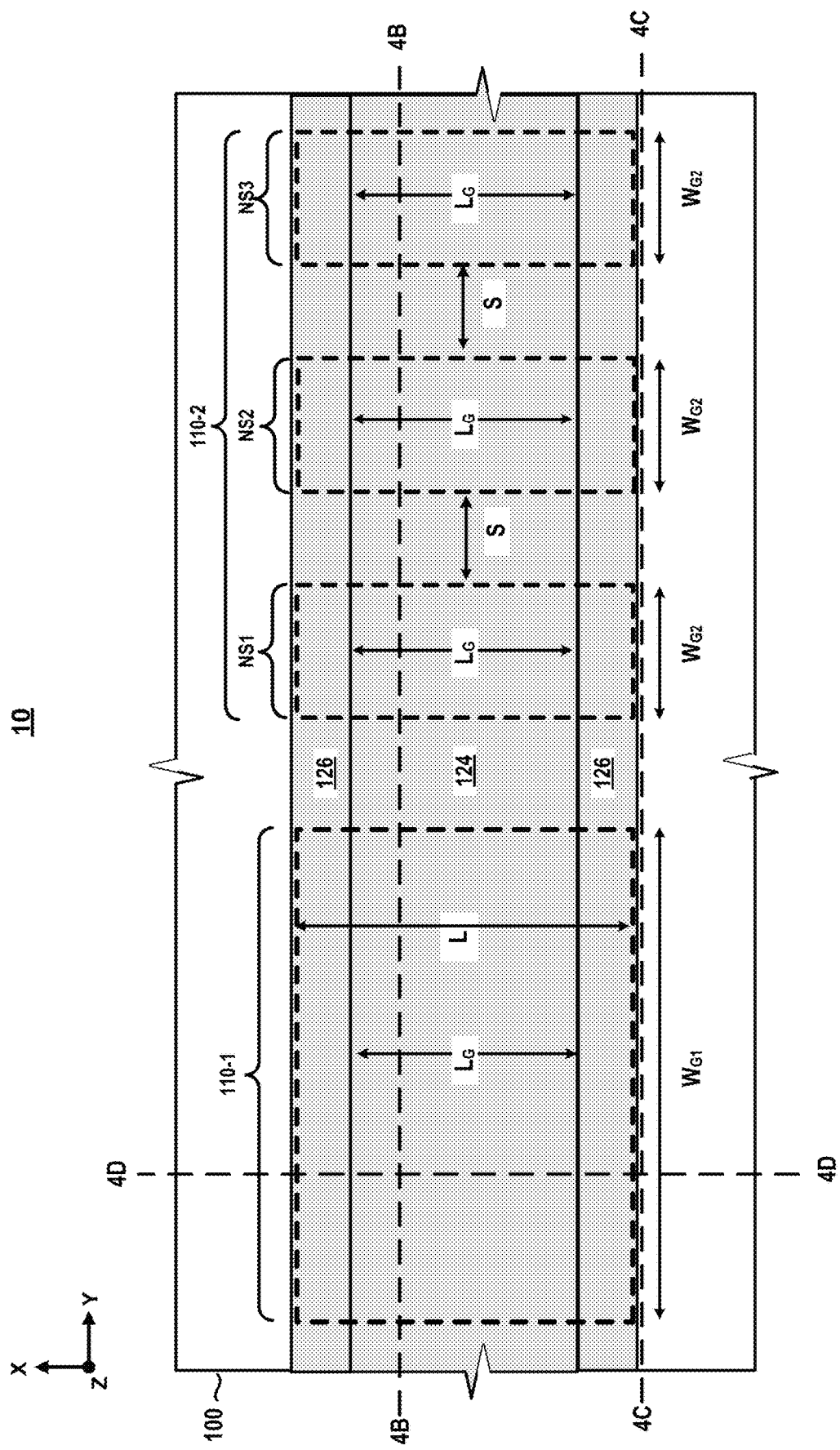
FIG. 4A is a schematic top plan view of the device structure shown FIG. 3A after forming a dummy gate structure which overlaps portions of the nanosheet stack structures of the N-type and P-type nanosheet FET devices, and after patterning exposed portions of the nanosheet stack structures in source/drain regions adjacent to the dummy gate structure to define a length of the nanosheet stack structures.
Figure 4B:
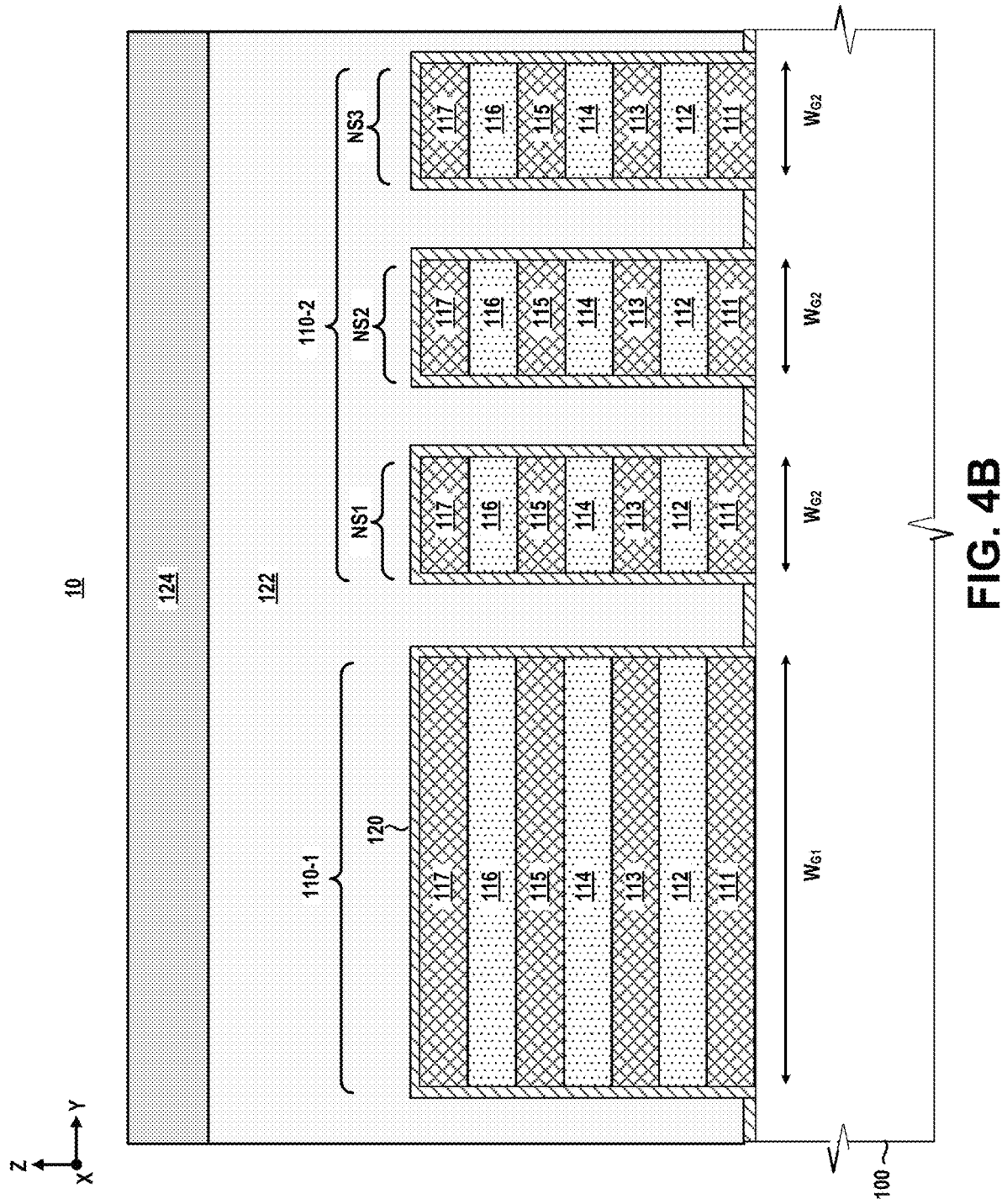
FIG. 4B is a schematic cross-sectional side view device structure along line 4B-4B shown in FIG. 4A.
Figure 4C:
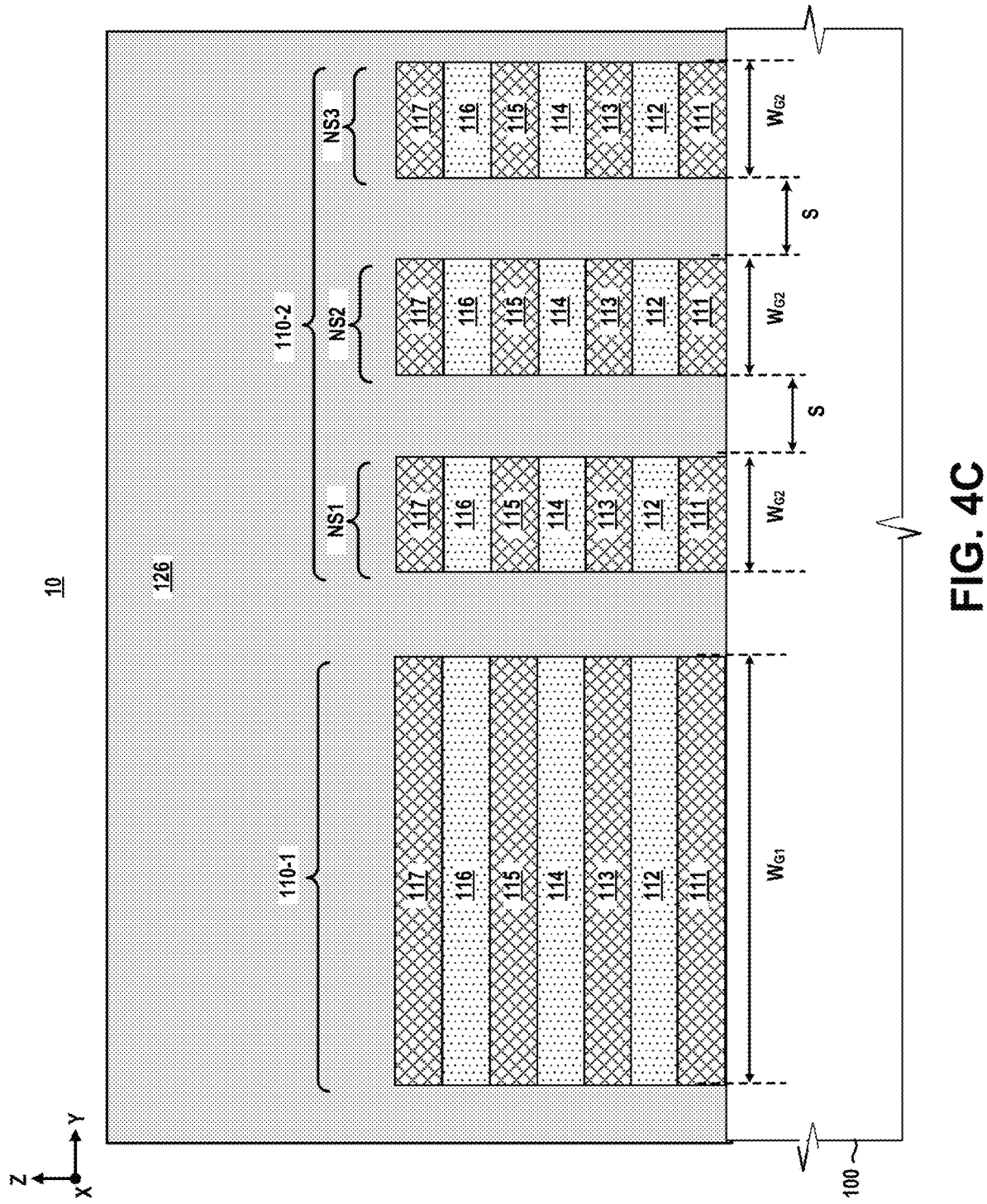
FIG. 4C is a schematic cross-sectional side view of the device structure along line 4C-4C shown in FIG. 4A.
Figure 4D:
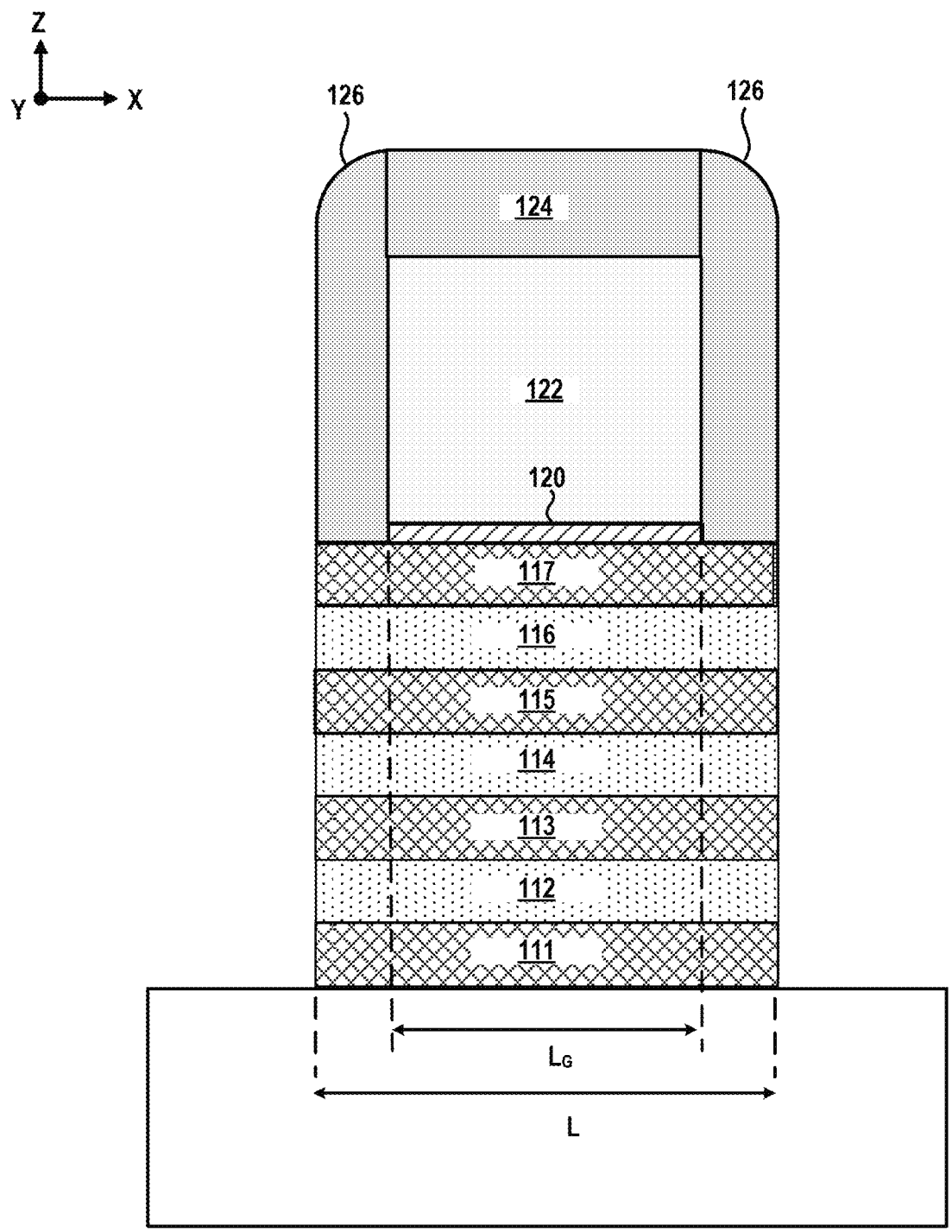
FIG. 4D is a schematic cross-sectional side view of the device structure along line 4D-4D shown in FIG. 4A.

Next, FIGS. 4A, 4B, 4C, and 4D are schematic views of the semiconductor IC device shown in FIGS. 3A and 3B after forming a dummy gate structure which overlaps portions of the nanosheet stack structures 110-1 and 110-2, and after patterning exposed portions of the nanosheet stack structures 110-1 and 110-2 in source/drain regions adjacent to the dummy gate structure to define a length L of the nanosheet stack structures 110-1 and 110-2. In particular, FIG. 4A is a schematic top plan view (X-Y plane) of the device structure, FIG. 4B is a schematic cross-sectional side view (Y-Z plane) of the device structure along line 4B-4B shown in FIG. 4A, FIG. 4C is a schematic cross-sectional side view (Y-Z plane) of the device structure along line 4C-4C shown in FIG. 4A, and FIG. 4D is a schematic cross-sectional side view (X-Z plane) of the device structure along line 4D-4D shown in FIG. 4A.

As shown in FIGS. 4A-4D, the dummy gate structure includes a dummy gate oxide layer 120 and a dummy gate electrode layer 122 (e.g., sacrificial polysilicon or amorphous silicon material). In addition, the gate structure includes a gate capping layer 124 and a gate sidewall spacer 126. The dummy gate oxide layer 120 and the dummy gate electrode layer 122 comprise sacrificial gate material which is subsequently removed as part of a replacement metal gate (RMG) process and replaced with a high-k gate dielectric material and metallic material to form the common HKMG gate structure 150 for the N-type and P-type nanosheet FET devices D1 and D2.

The resulting device structure shown in FIGS. 4A-4D is fabricated using known methods. For example, a thin conformal layer of silicon oxide is deposited over the entire surface of the semiconductor IC device shown in FIGS. 3A and 3B, and a layer of polysilicon (or alternatively, amorphous silicon) is blanket deposited over the conformal layer of silicon oxide, and then planarized using known techniques. A hard mask layer is formed on the planarized surface of the polysilicon layer by depositing a layer of dielectric material or multiple layers of dielectric materials (e.g., SiN, SiOCN, SiBCN). The hard mask layer is then patterned to form the gate capping layer 124, which defines an image of the gate structure. The gate capping layer 124 is then utilized as an etch hardmask to anisotropically etch (e.g., RIE) the sacrificial polysilicon and oxide layers to thereby form the dummy gate layers 120 and 122.

The gate sidewall spacer 126 is then formed by depositing a conformal layer of dielectric material over the entire surface of the semiconductor IC device. The conformal layer of dielectric material can be formed of SiN, SiBCN, SiCON, or any other type of low-k dielectric material that is commonly used to form insulating gate sidewall spacers of FET devices, and deposited using known techniques such as ALD, CVD and PVD. The conformal layer of dielectric material is then patterned by performing an anisotropic dry etch process, such as RIE, to etch down the conformal layer of dielectric material in a vertical direction. This etch process is performed selective to the semiconductor materials of the nanosheet stack structures 110-1 and 110-2. The etch process results in the formation of the gate sidewall spacer 126, which surrounds the dummy gate layers 120 and 122 and the gate capping layer 124. The gate sidewall spacer 126 defines common a gate region of the N-type and P-type nanosheet FET devices D1 and D2.

After forming the gate sidewall spacer 126, an anisotropic dry etch process (e.g., RIE) is performed to etch the exposed portions of the nanosheet stack structures 110-1 and 110-2 in the source/drain regions adjacent to the gate structure down to the substrate 100 and/or isolation layer. The etch process results in defining the overall length L (in the X-direction) of the individual nanosheet stack structures 110-1 and 110-2 (and the nanosheet stacks NS1, NS2, and NS3), as shown in FIGS. 4A and 4D. The gate widths $W_{G1}$ and $W_{G2}$ (in the Y-direction) of the nanosheet stack structures 110-1 and 110-2 are maintained since the sidewall surfaces of the nanosheet stack structures 110-1 and 110-2 which define the gate widths $W_{G1}$ and $W_{G2}$ are covered by the dummy gate layers 120 and 122, and the gate sidewall spacers 126 (see, e.g., FIGS. 4B and 4C).

Figure 5B:
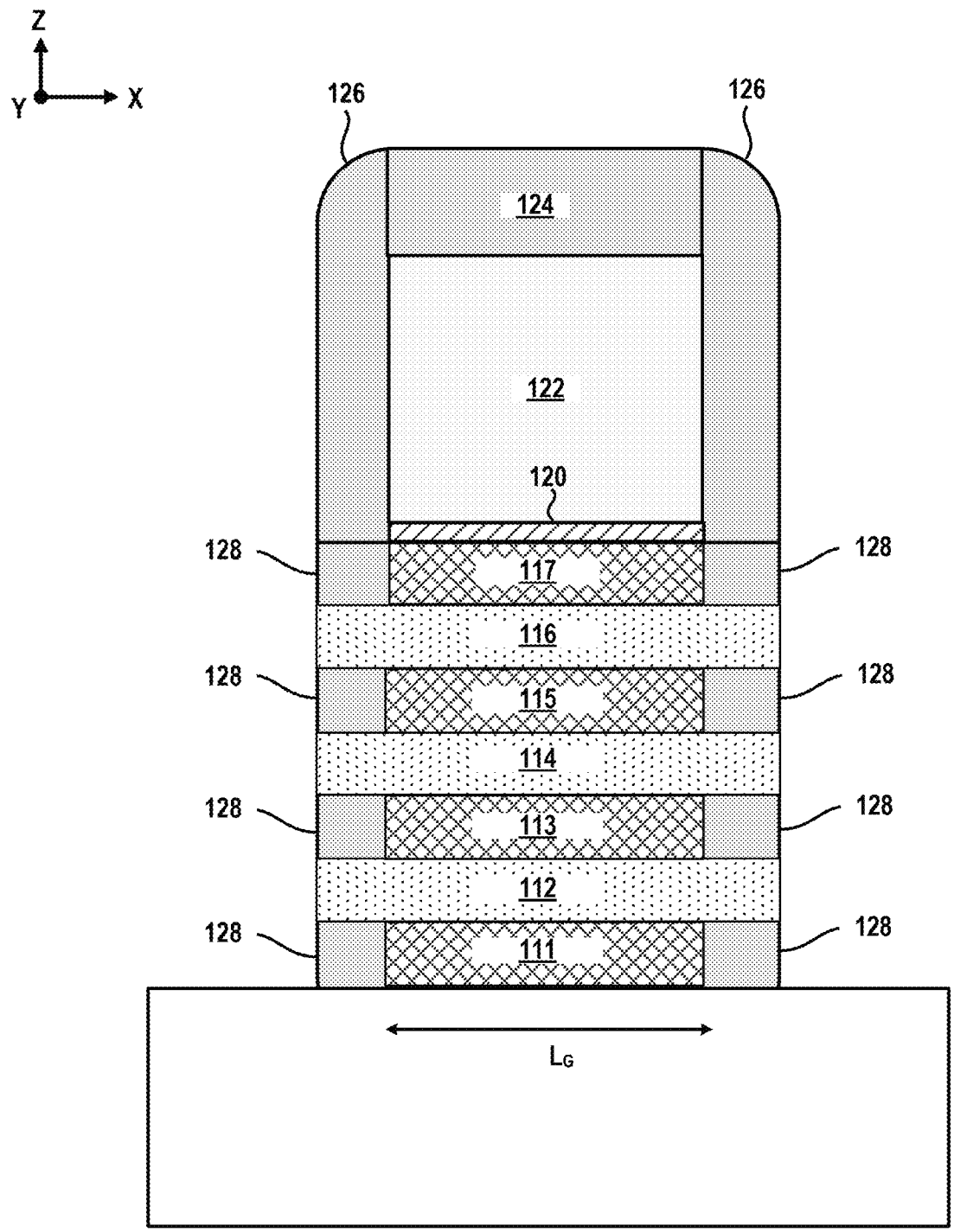
FIG. 5B is a schematic cross-sectional side view of the device structure along line 5B-5B shown in FIG. 5A.

Next, FIGS. 5A and 5B are schematic views of the semiconductor IC device shown in FIGS. 4A-4D after forming the embedded gate sidewall spacers 128 within sidewalls of the nanosheet stack structure 110-1 and 110-2. In particular FIG. 5A is a schematic cross-sectional side view (Y-Z plane) of the device structure shown in FIG. 4C after forming the embedded gate sidewall spacers 128, and FIG. 5B is a schematic cross-sectional side view (X-Z plane) of the device structure along line 5B-5B shown in FIG. 5A. The embedded gate sidewall spacers 128 are formed using known methods. For example, in one exemplary process flow, the process begins by laterally recessing (in the X-direction) exposed sidewall surfaces of the sacrificial nanosheet layers 111, 113, 115, and 117 of the nanosheet stack structures 110-1 and 110-2 to form recesses in the sidewalls of the nanosheet stack structures 110-1 and 110-2. The depth of the lateral recess is controlled through a timed etch. In one embodiment, the exposed sidewall surfaces of the sacrificial nanosheet layers 111, 113, 115, and 117 are recessed to a depth which is equal to a lateral thickness of the gate sidewall spacers 126. The lateral etch process can be performed using an isotropic wet etch process with an etch solution that is suitable to etch the semiconductor material (e.g., SiGe) of the sacrificial nanosheet layers 111, 113, 115, and 117 of the nanosheet stack structures 110-1 and 110-2 selective to the semiconductor material (e.g., Si) of the active nanosheet channel layers 112, 114, and 116, and other exposed elements.

Next, the embedded gate sidewall spacers 128 are formed by depositing a conformal layer of dielectric material over the semiconductor IC device until the recesses in the sidewalls of the nanosheet stack structures 110-1 and 110-2 are filled with dielectric material, followed by an etch back to remove the excess dielectric material from the gate structure and the substrate 100. The dielectric material is deposited using a highly conformal deposition process, such as ALD, to ensure that the recesses are sufficiently filled with dielectric material. The embedded gate sidewall spacers 128 can be formed of the same dielectric material used to form the gate sidewall spacer 126. For example, the embedded gate sidewall spacers 128 can be formed of SiN, SiBCN, SiCO, SiBCN, SiCON, or any other suitable type of dielectric material (e.g., a low-k dielectric material having a k of less than 5, wherein k is the relative dielectric constant). The conformal layer of dielectric material can be etched back using an isotropic (wet or dry) etch process to remove the excess dielectric material, while leaving the dielectric material in the recesses to form the embedded gate sidewall spacers 128. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HFEG), hydrochloric acid (HCl), or any combination thereof.

Figure 6A:
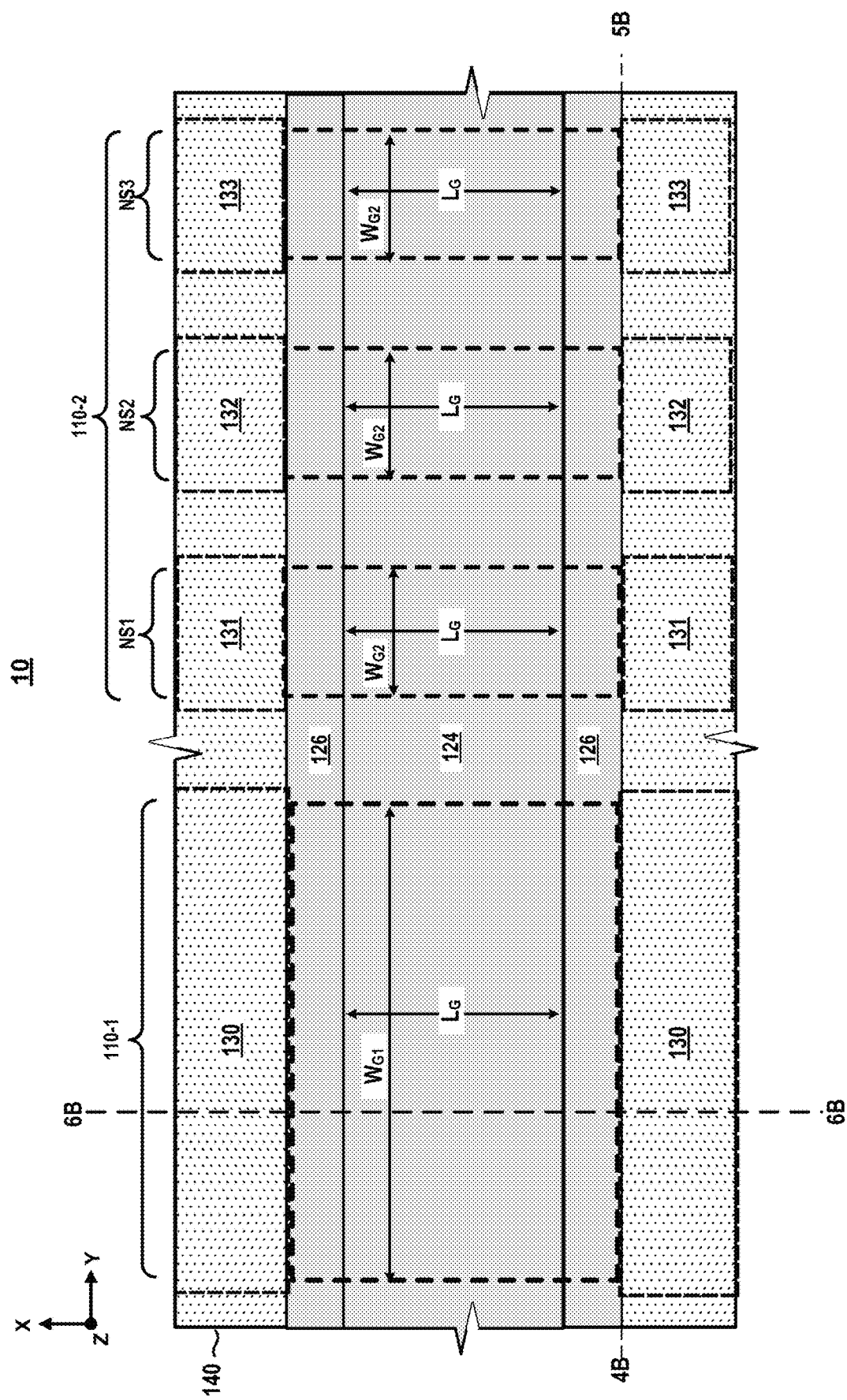
FIG. 6A is a schematic top plan view of the device structure of FIGS. 5A and 5B after forming source/drain layers of the N-type and P-type nanosheet FET devices, and after forming an insulating layer to cover the nanosheet FET devices.
Figure 6B:
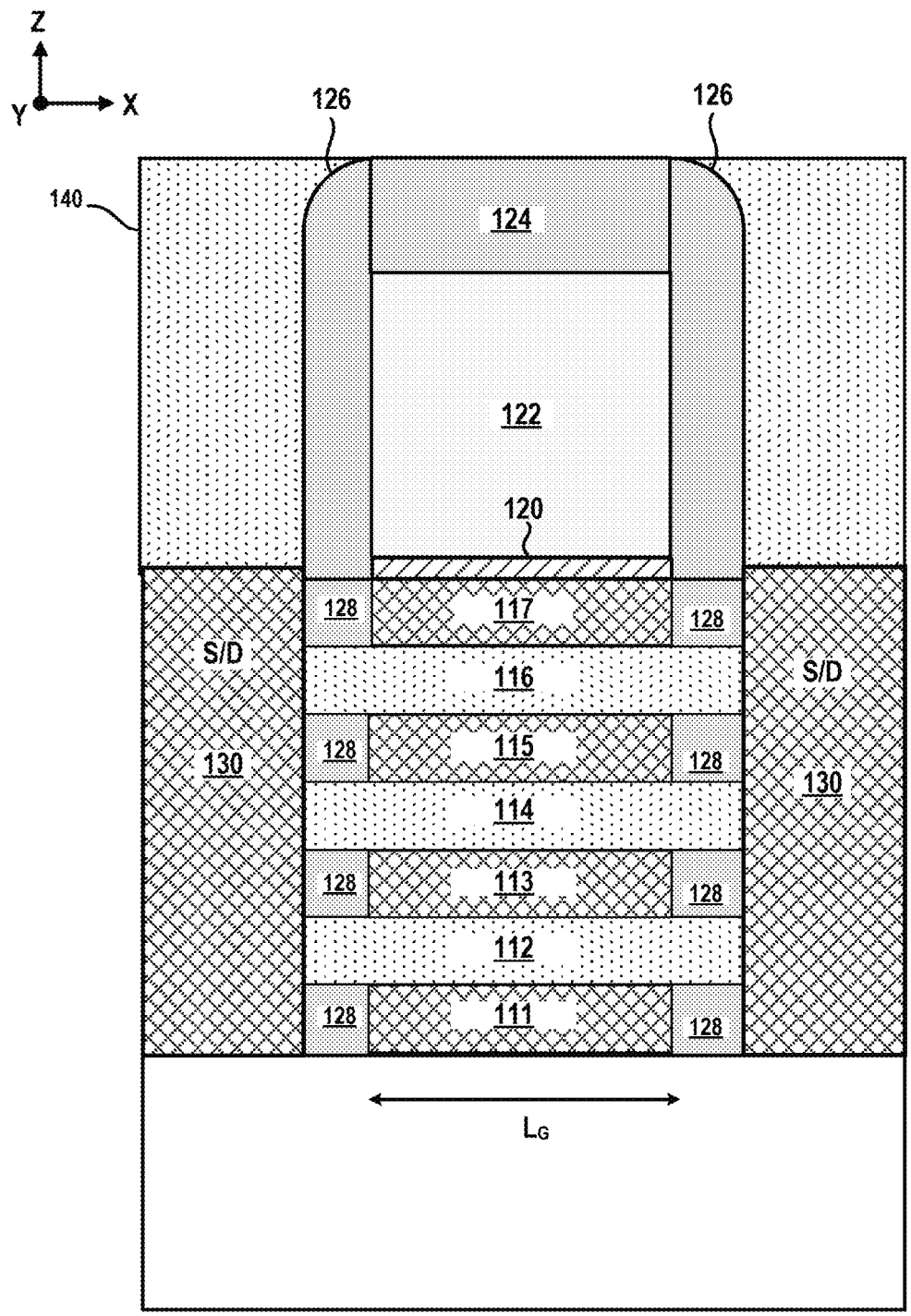
FIG. 6B is schematic cross-sectional side view of the device structure along line 6B-6B shown in FIG. 6A.

Next, FIGS. 6A and 6B are schematic views of the device structure of FIGS. 5A and 5B after forming source/drain layers 130 of the N-type nanosheet FET device D1 and source/drain layers 131, 132 and 133 of the P-type nanosheet FET device D2, and after forming an insulating layer 140 (e.g., ILD or PMD layer) to cover the nanosheet FET devices D1 and D2. In particular, FIG. 6A is a schematic top plan view (X-Y plane) of the device structure and FIG. 6B is schematic cross-sectional side view of the device structure along line 6B-6B shown in FIG. 6A. The source/drain layers 130, 131, 132 and 133 are formed by epitaxially growing semiconductor material (e.g., epitaxial Si material, SiGe material, carbon-doped silicon (Si:C) material) on the exposed sidewall surfaces of the active nanosheet channel layers 112, 114, and 116 using known techniques such as CVD, MOCVD, LPCVD, MBE, VPE, or other known epitaxial growth techniques which are suitable for the given process flow.

More specifically, in the exemplary embodiment shown in FIGS. 6A and 6B, the exposed sidewall surfaces of the active nanosheet channel layers 112, 114, and 116 of the nanosheet stack structure 110-1 provide surface areas to seed the epitaxial growth of the source/drain layers 130 of the N-type nanosheet FET device D1. Similarly, the exposed sidewall surfaces of the active nanosheet channel layers 112, 114, and 116 of the nanosheet stacks NS1, NS2, and NS3 of the nanosheet stack structure 110-2 provide surface areas to seed the epitaxial growth of the source/drain layers 131, 132, and 133, respectively, of the P-type nanosheet FET device D2. The type of epitaxial semiconductor material that is used to form the source/drain layers 130, 131, 132, and 133 will vary depending on, e.g., the device type (e.g., N-type or P-type) of the nanosheet FET device, etc. The source/drain layers 130 of the N-type nanosheet FET devices and the source/drain layers 131, 132, and 133 of the P-type nanosheet FET devices are formed using separate epitaxial deposition processes.

In some embodiments, the epitaxial growth of the source/drain layers 130, 131, 132 and 133 on the ends of the active nanosheet channel layers 112, 114 and 116 is performed so that the epitaxial material merges (in the Z-direction) to form merged source/drain layers 130, 131, 132 and 133. For example, as shown in FIG. 6B, the epitaxial material that is grown on the exposed sidewall surfaces of the active nanosheet channel layers 112, 114, and 116 merges (in the vertical Z direction) to form a single, merged source/drain layer 130 on opposing sides of the nanosheet stack structure 110-1. Furthermore, in some embodiments, the source/drain layers 130, 131, 132 and 133 are doped using known techniques. For example, in one embodiment, the source/drain layers 130, 131, 132 and 133 are "in-situ" doped during epitaxial growth by adding a dopant gas to the source deposition gas (i.e., the Si-containing gas). Exemplary dopant gases may include a boron (B) containing gas such as $BH_3$ for P-type FETs or a phosphorus (P) or arsenic (As) containing gas such as $PH_3$ or $AsH_3$ for n-type FETs, wherein the concentration of impurity in the gas phase determines its concentration in the epitaxially grown semiconductor material.

The use of an in-situ doping process is merely an example. For instance, an ex-situ process may be used to introduce dopants into the source/drain layers. Other doping techniques can be used to incorporate dopants in the source/drain layers. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques.

In addition, in some embodiments, a thermal anneal process is performed following the epitaxial growth and doping of the source/drain layers 130, 131, 132, and 133 to cause dopants to be injected into the end portions of the active nanosheet channel layers 112, 114, and 116 that are in contact with the epitaxial semiconductor material of the source/drain layers. This anneal process effectively results in extending the source/drain layers into the semiconductor material of the end portions of the active nanosheet channel layers 112, 114, and 116, which results in a decrease in the parasitic resistance of the nanosheet FET devices. In other embodiments, the thermal anneal process is performed in later process (such as after the formation of the high-k gate dielectric layers) so that the same anneal process can serve two purposes at the same time: driving dopants into the active nanosheet channel layers, and improve the reliability of the high-k gate dielectric.

Following the formation of the epitaxial source/drain layers 130, 131, 132, and 133, the process flow continues with forming the insulating layer 140 (e.g., ILD layer, or PMD layer) to encapsulate the gate structure and source/drain layers 130, 131, 132, and 133 in dielectric/insulating material, prior to commencing a replacement metal gate process. In one embodiment, the insulating layer 140 is formed by depositing a blanket layer of dielectric/insulating material over the semiconductor IC device and planarizing the layer of dielectric/insulating material down to the gate capping layer 124 to form the insulating layer 140, as shown schematically shown in FIG. 6B.

The insulating layer 140 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the insulating layer 140 is deposited using known deposition techniques, such as, for example, ALD, CVD, PECVD, PVD, or spin-on deposition. In one embodiment, the layer of dielectric/insulating material is planarized using a standard planarization process such as CMP to remove the overburden dielectric/insulating down to the upper surface of the dummy gate capping layer 124. In some embodiments, the insulating layer 140 comprises a conformal silicon nitride liner that is initially formed on the exposed surfaces of dummy gate structure and source/drain layers 130, 131, 132, and 133 before blanket depositing one or more insulating materials to form the insulating layer 140.

Figure 7B:
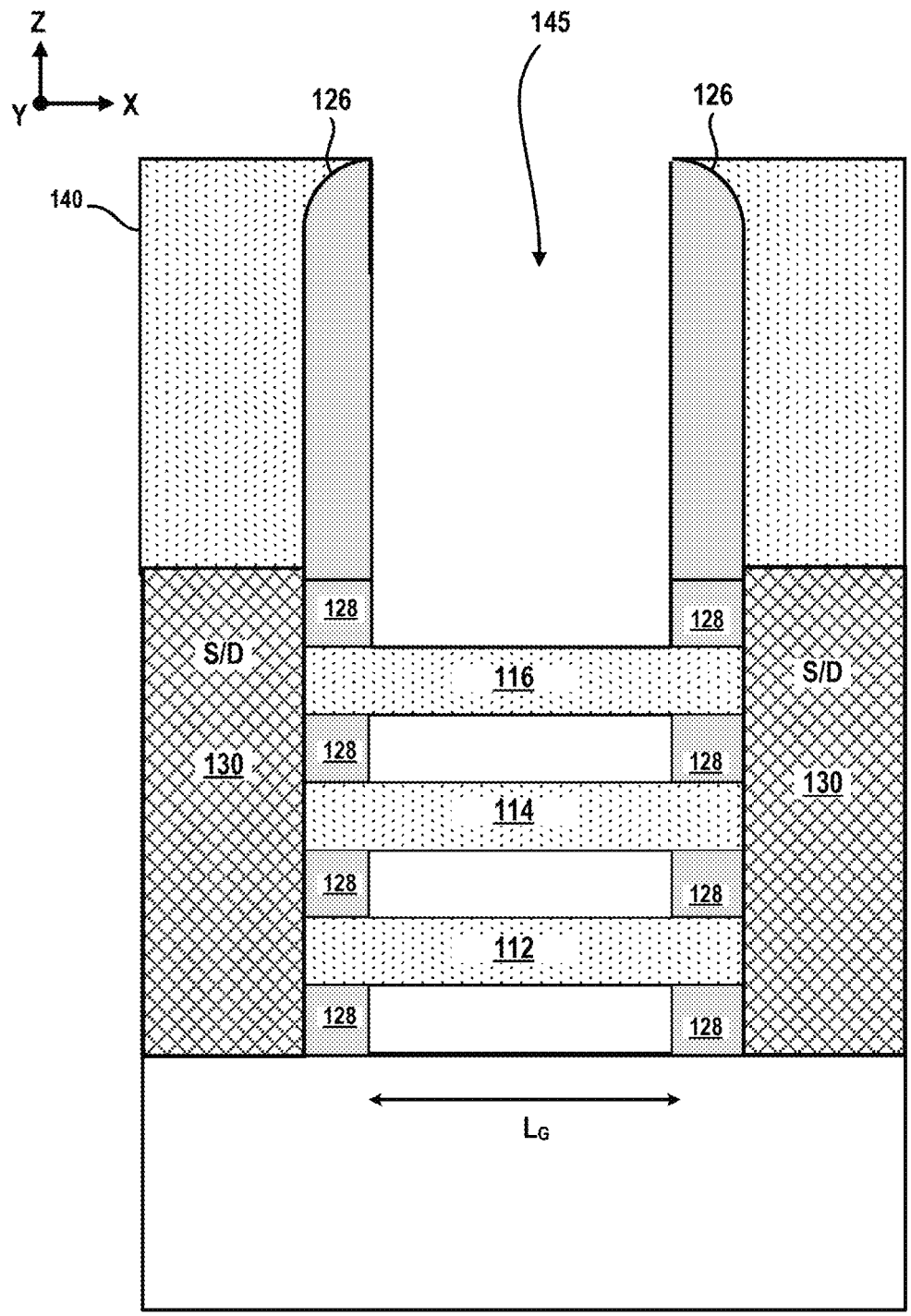
FIG. 7B is a schematic cross-sectional side view of the device structure along line 7B-7B shown in FIG. 7A.

Following the formation of the insulating layer 140, a replacement metal gate process is performed to replace the sacrificial gate dummy gate materials with the common HKMG structure 150, using a process flow as schematically illustrated in FIGS. 7A through 8B. For example, FIGS. 7A and 7B are schematic views of the device structure shown in FIGS. 6A and 6B after removing the dummy gate capping layer 124 and the dummy gate sacrificial layers (e.g., the dummy gate oxide layer 120 and the dummy gate electrode layer 122), and after removing the sacrificial nanosheet layers 111, 113, 115, and 117 to release the active nanosheet channel layers 112, 114 and 116 of the nanosheet stack structures 110-1 and 110-2 and form an open gate region 145. FIG. 7A is schematic cross-sectional side view (Y-Z plane) of the device structure, and FIG. 7B is a schematic cross-sectional side view (X-Z plane) of the device structure along line 7B-7B shown in FIG. 7A.

In one embodiment, the dummy gate capping layer 124 can be removed by planarizing (e.g., via CMP) the surface of the semiconductor IC device shown in FIGS. 6A and 6B down to the upper surface of the dummy gate electrode layer 122. In another embodiment, the dielectric material of the dummy gate capping layer 124 (e.g., SiN) can be etched away selective to the materials of the gate sidewall spacer 126 (e.g., SiBCN) and the insulating layer 140 (e.g., silicon oxide) to expose the underlying dummy gate electrode layer 122. The dummy gate electrode layer 122 (e.g., sacrificial polysilicon layer, or amorphous silicon layer) and dummy gate oxide layer 120 are then etched away using known etching techniques and etch chemistries.

For example, the sacrificial dummy gate polysilicon material can be removed using a selective dry etch or wet etch process with suitable etch chemistries, including ammonium hydroxide ($NH_4OH$), tetramethylammonium hydroxide (TMAH), or SF6 plasma. The etching of the dummy poly gate layer is selective to, e.g., dummy gate oxide layer, to thereby protect the active nanosheet channel layers 112, 114, and 116 from being etched during the poly etch process. After the polysilicon material is removed, an oxide etch process is performed to etch away the dummy gate oxide layer 120 selective to, e.g., the active nanosheet channel layers 112, 114, and 116. In this manner, the sacrificial materials (e.g., dummy polysilicon and oxide layers) of the dummy gate can be etched away without damaging the active nanosheet channel layers 112, 114, and 116.

After removing the dummy gate layers 122 and 120, an etch process is performed to selectively etch away the sacrificial nanosheet layers 111, 113, 115, and 117 of the nanosheet stack structures 110-1 and 110-2 and thereby release the active nanosheet channel layers 112, 114, and 116 and extend the open gate region 145 into spaces between and adjacent to the active nanosheet channel layers 112, 114, and 116. The sacrificial nanosheet layers 111, 113, 115, and 117 (e.g., SiGe layers) are etched selective to the active nanosheet channel layers 112, 114, and 116 (e.g., Si layers). In one embodiment, the SiGe material of the sacrificial nanosheet layers 111, 113, 115, and 117 can be selectively etched (with high etch selectivity) using a gas phase HCl (hydrochloric acid) or wet etch solution containing hydrogen peroxide ($H_2O_2$) to etch the SiGe material of the sacrificial nanosheet layers 111, 113, 115, and 117 selective to the Si material of the active nanosheet channel layers 112, 114, and 116. The gas phase HCl (hydrochloric acid) provides high etch selectivity when, for example, the active nanosheet channel layers 112, 114, and 116 are formed of Si or SiGe with a lower Ge concentration than the SiGe material of the sacrificial nanosheet layers 111, 113, 115, and 117.

Figure 8A:
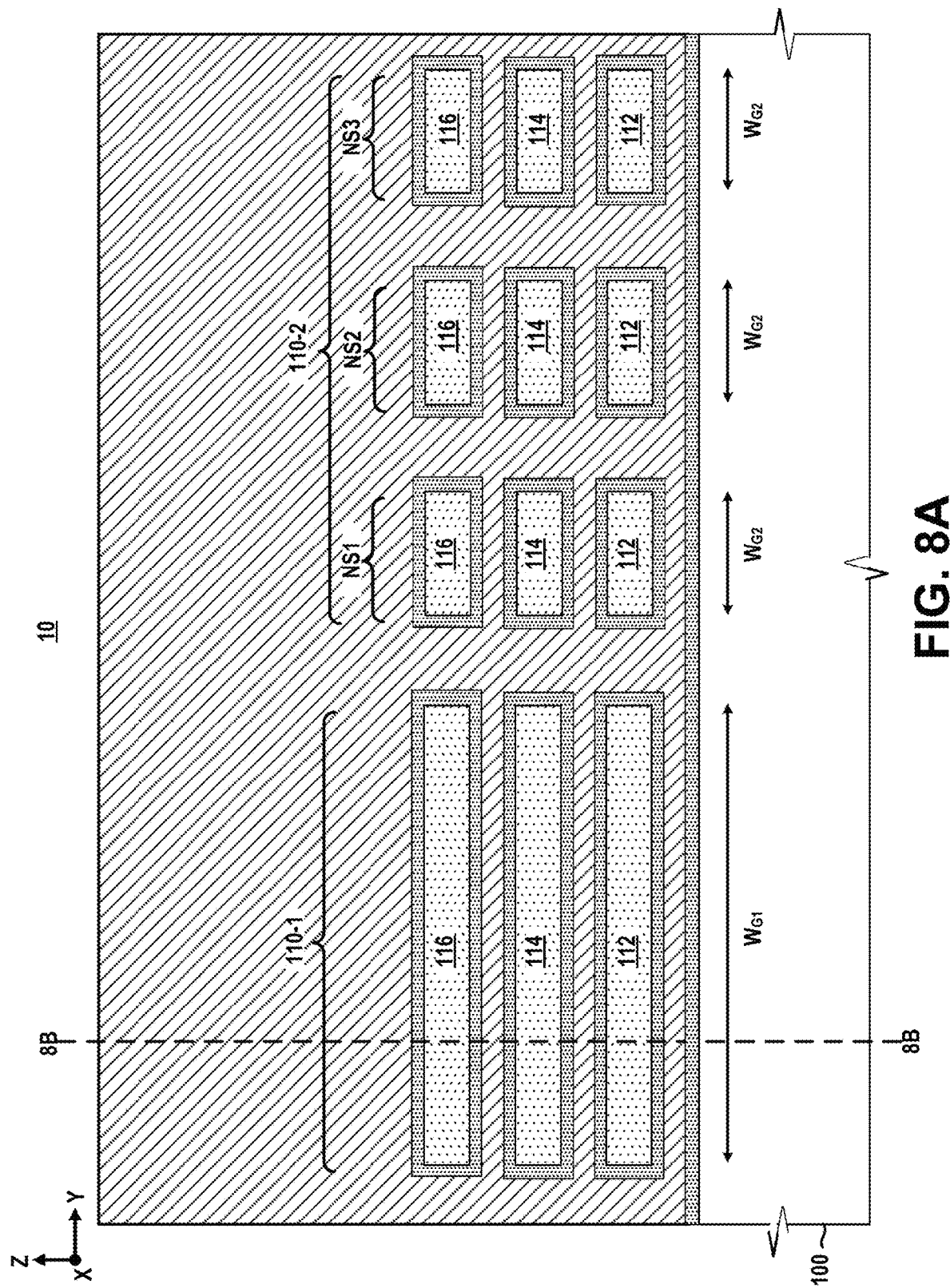
FIG. 8A is a schematic cross-sectional side view of the device structure shown in FIGS. 7A and 7B after forming a high-k dielectric/metal gate structure in place of the dummy gate structure.
Figure 8B:
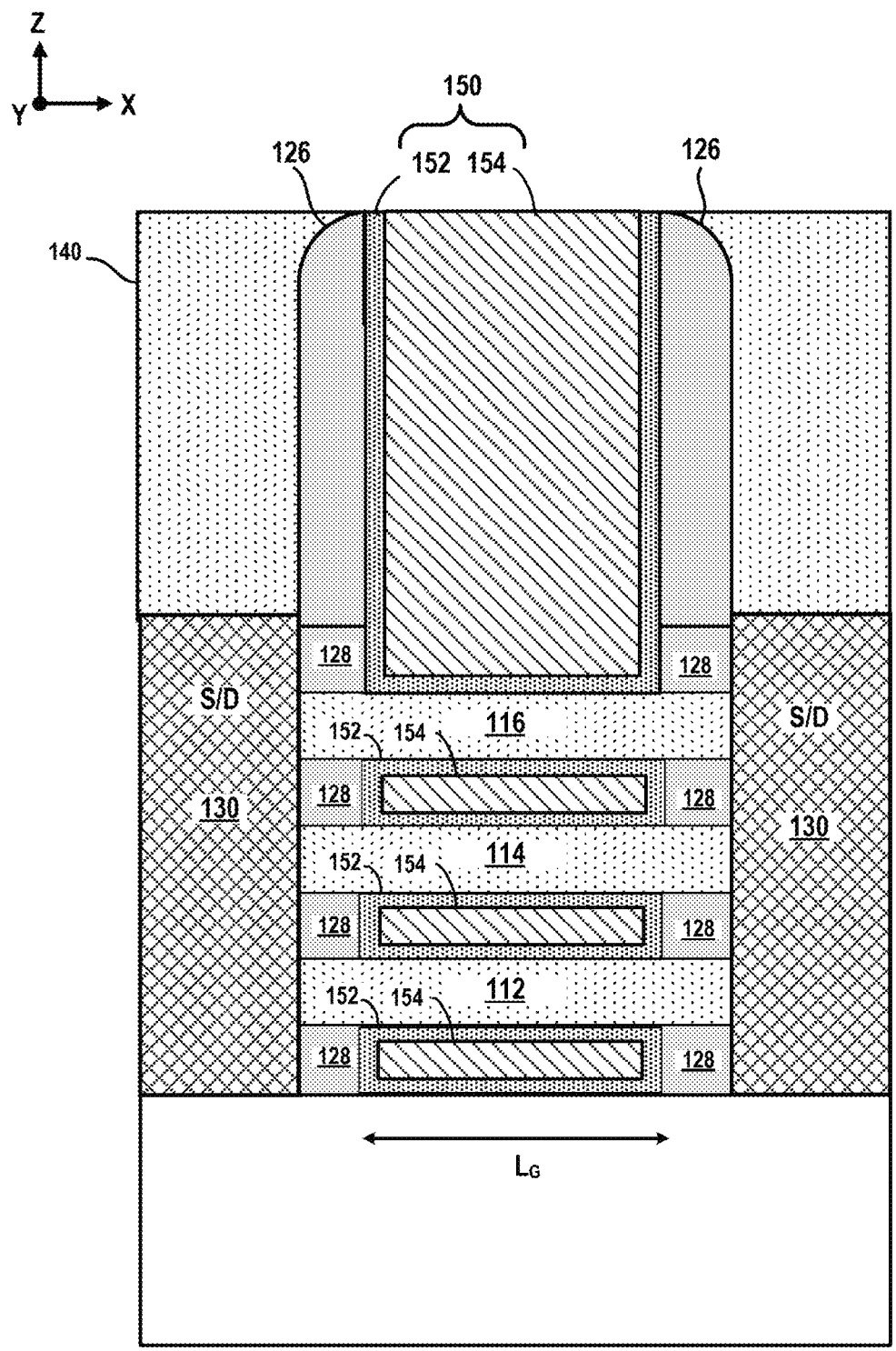

Next, FIGS. 8A and 8B are schematic cross-sectional side views of the device structure shown in FIGS. 7A and 7B, respectively, after forming the HKMG structure 150. FIG. 8B is a schematic cross-sectional side view (X-Z plane) of the device structure along line 8B-8B shown in FIG. 8A. The HKMG structure 150 comprises high-k gate dielectric layers 152 formed on exposed surfaces of the active nanosheet channel layers 112, 114 and 116, and a metal gate layer 154. In one embodiment, the HKMG structure 150 is formed by depositing one or more conformal layers of high-k gate dielectric material over the exposed surfaces of the semiconductor structure to conformally cover the surfaces of the active nanosheet channel layers 112, 114, and 116. The high-k gate dielectric layers 152 are preferably formed of high-k dielectric material having a dielectric constant of about 3.9 or greater.

For example, the gate dielectric material can include but is not limited to metal oxides such as hafnium oxide, hafnium silicon oxide, hafnium silicon oxynitride, hafnium zirconium oxide, and nitride films thereof. In other embodiments, the high-k dielectric may comprise lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal high-k gate dielectric layers 152 are formed with a thickness in a range of about 0.5 nm to about 2.0 nm, which will vary depending on the target application. The conformal layer of high-k gate dielectric material is deposited using known methods such as ALD, for example, which allows for high conformality of the gate dielectric material.

As is known in the art, the use of high-k gate dielectric materials can be problematic in that such dielectric materials typically do not interface well with silicon layers. For example, high-k gate dielectric materials do not passivate a silicon surface, which results in a large number of interface traps and charges and other issues which can degrade device performance. As such, in one exemplary embodiment, before depositing the high-k dielectric material to form the high-k gate dielectric layers 152, a channel pre-clean process is performed to clean the exposed silicon surfaces of the active nanosheet channel layers 112, 114, and 116, which is then followed by an oxidation process to grow ultra-thin interfacial silicon oxide layers on the exposed surfaces of the active nanosheet channel layers 112, 114, and 116. It is to be understood that the formation of the interfacial silicon oxide layers is an optional step and that in other embodiments of the invention, the high-k dielectric material of the HKMG structure 150 can be formed on the exposed silicon surfaces of the active nanosheet channel layers 112, 114, and 116 without initially forming the thin interfacial oxide layers.

In one exemplary embodiment, the interfacial silicon oxide layers are formed using a chemical oxidation process in an ozonated deionized water comprising ozone, and a suitable oxidation temperature, ozone concentration in the deionized water, and chemical oxidation process time to form thin interfacial silicon oxide layers. The interfacial layers are formed by oxidizing the exposed silicon surfaces of the active nanosheet channel layers 112, 114, and 116 to form thin interfacial silicon oxide layers with a thickness in a range of about 5 angstroms to about 10 angstroms (i.e., about 0.5 nm to about 1 nm).

In some embodiments, the metal gate layer 154 comprises one or more work function metal layers which are conformally deposited over the high-k gate dielectric layer 152. The work function metal layer(s) may comprise one or more types of metallic materials, including, but not limited to, titanium nitride (TiN), tantalum nitride (TaN), and an Al-containing alloy (e.g., TiAlC, TiAl, and AlC, or nitrided alloys thereof). In other embodiments, the work function metal layer(s) may comprise a metallic material which comprises a composition or alloy of Zr, W, Hf, Ti, Al, Ru, Pa, ZrAl, WAl, TaAl, HfAl, TaC, TiC, TaMgC, and other types, compositions, or alloys of work function metals that are commonly used to obtain target work functions for the nanosheet FET devices. The work function metal layers are conformally deposited using known methods such as ALD, CVD, etc., which allow for high conformality of the deposited work function metal layers.

In some embodiments, the work function metal layers completely fill the spaces above and below the active nanosheet channel layers 112, 114, and 116. Indeed, in instances where the initial spacing between the active nanosheet channels 112, 114 and 116 is relatively small (e.g., 7 nm to 10 nm), after formation of the high-k dielectric layer 152, the conformal deposition of a stack of two or more work function metal layers can result in filling (i.e., pinch-off) the spaces above and below the active nanosheet channel layers 112, 114, and 116 such that the spaces are filled with gate dielectric material and work function metal. This is sufficient for short-channel length nanosheet FET devices where $L_G$ is about 15 nm or less.

Furthermore, in some embodiments, the remaining portions of the open gate region 145 above the active nanosheet channel layers 116 can be filled with work function metal by continuing the deposition process for the last deposited work function metal layer until the open gate region 145 above the active nanosheet channel layers 116 is completely filled with the work function metal layer. In other embodiments, the remaining portion of the open gate region 145 can be filled with a low-resistance metallic material such as tungsten, ruthenium, cobalt, copper, aluminum, etc. to form a metallic gate electrode apart from the work function metal.

Following the deposition of the dielectric and metallic materials that form the HKMG structure 150, a CMP process is performed to polish the surface of the semiconductor device structure down to the ILD layer 140, thereby removing overburden portions of the gate dielectric, work function, and gate electrode layers, resulting in the semiconductor structure shown in FIGS. 8A and 8B. Following formation of HKMG structure 150, any known sequence of processing steps can be performed to complete the fabrication of the semiconductor integrated circuit device, the details of which are not needed to understand embodiments of the invention.

Briefly, following the formation of the HKMG structure 150, an etch process can be performed to recess an upper surface of the HKMG structure 150 down to a target level below the upper surface of the insulating layer 140. A layer of dielectric material is then deposited over the surface of the semiconductor device structure to fill the area above the recessed surface of the HKMG structure 150 with dielectric material, and the semiconductor device structure is planarized down to the surface of the insulating layer 140 to remove the overburden dielectric material, and thereby form the gate capping layer 160 (as shown in FIG. 1A-1C). The gate capping layer 160 can be formed of a dielectric material such as SiN or SiBCN, etc.

Next, middle-of-the-line (MOL) processing can continue to form MOL contacts such as vertical source/drain contacts and gate contacts, etc., using known materials and fabrication techniques. Then, a back-end-of-line (BEOL) process module can be performed to fabricate a BEOL interconnect structure which provides connections to/between the MOL contacts, and other active or passive devices that are formed as part of the front-end-of-line (FEOL) layer.

It is to be understood that the exemplary methods discussed herein for fabricating gate-all-around FET devices such as nanosheet FET devices, wherein the channel orientation layout of N-type and P-type FET devices are independently configured to provide enhanced carrier mobility in the channel layers of the FET devices, can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor integrated circuit device, comprising:
   a first-type nanosheet field-effect transistor device and a second-type nanosheet field-effect transistor device disposed on a semiconductor substrate;
   wherein the first-type nanosheet field-effect transistor device comprises a first nanosheet stack structure comprising a stack of nanosheet channel layers, wherein each nanosheet channel layer of the first nanosheet stack structure comprises a first channel width;
   wherein the second-type nanosheet field-effect transistor device comprises a second nanosheet stack structure comprising at least a first stack of nanosheet channel layers and a second stack of nanosheet channel layers, wherein the first and second stacks of nanosheet channel layers are disposed adjacent to and spaced apart from each other, and wherein each nanosheet channel layer of the first and second stacks of nanosheet channel layers comprises a second channel width, which is less than the first channel width;
   wherein horizontal surfaces of the nanosheet channel layers of the first and second nanosheet stack structures are aligned with a first crystal plane of the nanosheet channel layers, which provides a greater carrier mobility of a first type of carrier over a second type of carrier; and
   wherein vertical surfaces of the nanosheet channel layers of the first and second nanosheet stack structures are aligned with a second crystal plane of the nanosheet channel layers, which provides a greater carrier mobility of the second type of carrier over the first type of carrier.

2. The device of claim 1, wherein the first-type nanosheet field-effect transistor device comprises a N-type nanosheet field-effect transistor device, wherein the second-type nanosheet field-effect transistor device comprises a P-type nanosheet field-effect transistor device, wherein the first type of carrier comprises electrons, and wherein the second type of carrier comprises holes.

3. The device of claim 1, wherein the first crystal plane comprises a <100> crystal plane, and wherein the second crystal plane comprises a <110> crystal plane.

4. The device of claim 1, wherein the nanosheet channel layers of the first and second nanosheet stack structures comprises a same channel length and a same channel thickness.

5. The device of claim 1, further comprising a common gate structure disposed around the first and second nanosheet stack structures.

6. The device of claim 5, wherein the common gate structure comprises a high-k dielectric/metal gate structure.

7. The device of claim 5, wherein the nanosheet channel layers of the first and second nanosheet stack structures comprise crystalline silicon channel layers.

8. The device of claim 5, wherein the first-type nanosheet field-effect transistor device and the second-type nanosheet field-effect transistor device form a complementary metal-oxide-semiconductor inverter device.

9. The device of claim 1, wherein the first channel width is in a range of about 50 nm to about 80 nm, and wherein the second channel width is in a range of about 10 nm to about 20 nm.

10. The device of claim 1, wherein the first and second stacks of nanosheet channel layers of the second nanosheet stack structure are spaced apart from each other by a distance of no less than 10 nm.

11. The device of claim 1, wherein the first nanosheet stack structure occupies a first footprint area of the semiconductor substrate, wherein the second nanosheet stack structure occupies a second footprint area of the semiconductor substrate, wherein the first and second footprint areas are substantially the same.

12. A method of fabricating a semiconductor integrated circuit device, comprising:
    forming a first-type nanosheet field-effect transistor device and a second-type nanosheet field-effect transistor device on a semiconductor substrate;
    wherein the first-type nanosheet field-effect transistor device is formed to include a first nanosheet stack structure comprising a stack of nanosheet channel layers, wherein each nanosheet channel layer of the first nanosheet stack structure comprises a first channel width;
    wherein the second-type nanosheet field-effect transistor device is formed to include a second nanosheet stack structure comprising at least a first stack of nanosheet channel layers and a second stack of nanosheet channel layers, wherein the first and second stacks of nanosheet channel layers are disposed adjacent to and spaced apart from each other, and wherein each nanosheet channel layer of the first and second stacks of nanosheet channel layers comprises a second channel width, which is less than the first channel width;
    wherein horizontal surfaces of the nanosheet channel layers of the first and second nanosheet stack structures are aligned with a first crystal plane of the nanosheet channel layers, which provides a greater carrier mobility of a first type of carrier over a second type of carrier; and
    wherein vertical surfaces of the nanosheet channel layers of the first and second nanosheet stack structures are aligned with a second crystal plane of the nanosheet channel layers, which provides a greater carrier mobility of the second type of carrier over the first type of carrier.

13. The method of claim 12, wherein the first-type nanosheet field-effect transistor device comprises a N-type nanosheet field-effect transistor device, wherein the second-type nanosheet field-effect transistor device comprises a P-type nanosheet field-effect transistor device, wherein the first type of carrier comprises electrons, and wherein the second type of carrier comprises holes.

14. The method of claim 12, wherein the first crystal plane comprises a <100> crystal plane, and wherein the second crystal plane comprises a <110> crystal plane.

15. A method of fabricating a semiconductor integrated circuit device, comprising:
    forming a nanosheet layer stack over a semiconductor substrate;
    patterning the nanosheet layer stack to thereby form (i) a first nanosheet stack structure of a first-type nanosheet field-effect transistor device and (ii) a second nanosheet stack structure of a second-type nanosheet field-effect transistor device;

wherein the first nanosheet stack structure comprises a stack of nanosheet channel layers, wherein each nanosheet channel layer of the first nanosheet stack structure comprises a first channel width;

wherein the second nanosheet stack structure comprises at least a first stack of nanosheet channel layers and a second stack of nanosheet channel layers, wherein the first and second stacks of nanosheet channel layers are disposed adjacent to and spaced apart from each other, and wherein each nanosheet channel layer of the first and second stacks of nanosheet channel layers comprises a second channel width, which is less than the first channel width;

wherein horizontal surfaces of the nanosheet channel layers of the first and second nanosheet stack structures are aligned with a first crystal plane of the nanosheet channel layers, which provides a greater carrier mobility of a first type of carrier over a second type of carrier; and wherein vertical surfaces of the nanosheet channel layers of the first and second nanosheet stack structures are aligned with a second crystal plane of the nanosheet channel layers, which provides a greater carrier mobility of the second type of carrier over the first type of carrier;

forming a common gate structure which surrounds the first and second nanosheet stack structures; and forming source/drain layers in contact with end portions of the nanosheet channel layers of the first and second nanosheet stack structures.

16. The method of claim 15, wherein the first-type nanosheet field-effect transistor device comprises a N-type nanosheet field-effect transistor device, wherein the second-type nanosheet field-effect transistor device comprises a P-type nanosheet field-effect transistor device, wherein the first type of carrier comprises electrons, and wherein the second type of carrier comprises holes.

17. The method of claim 15, wherein the first crystal plane comprises a <100> crystal plane, and wherein the second crystal plane comprises a <110> crystal plane.

18. The method of claim 15, wherein the common gate structure comprises a high-k dielectric/metal gate structure.

19. The method of claim 15, wherein the first channel width is in a range of about 50 nm to about 80 nm, and wherein the second channel width is in a range of about 10 nm to about 20 nm.

20. The method of claim 15, wherein the first nanosheet stack structure occupies a first footprint area of the semiconductor substrate, wherein the second nanosheet stack structure occupies a second footprint area of the semiconductor substrate, wherein the first and second footprint areas are substantially the same.

* * * * *